(12) United States Patent
Nakano et al.

(10) Patent No.: US 11,067,907 B2
(45) Date of Patent: Jul. 20, 2021

(54) TARGET SUPPLY DEVICE, EXTREME ULTRAVIOLET LIGHT GENERATING APPARATUS, AND ELECTRONIC DEVICE MANUFACTURING METHOD

(71) Applicant: Gigaphoton Inc., Tochigi (JP)

(72) Inventors: Masaki Nakano, Oyama (JP); Fumio Iwamoto, Oyama (JP)

(73) Assignee: Gigaphoton Inc., Tochigi (JP)

( * ) Notice: Subject to any disclaimer, the term of this patent is extended or adjusted under 35 U.S.C. 154(b) by 0 days.

(21) Appl. No.: 16/987,739

(22) Filed: Aug. 7, 2020

(65) Prior Publication Data

US 2020/0363735 A1    Nov. 19, 2020

Related U.S. Application Data

(63) Continuation of application No. PCT/JP2018/011078, filed on Mar. 20, 2018.

(51) Int. Cl.
*G03F 7/20* (2006.01)
*H05G 2/00* (2006.01)

(52) U.S. Cl.
CPC ......... *G03F 7/70875* (2013.01); *G03F 7/709* (2013.01); *G03F 7/70025* (2013.01);
(Continued)

(58) Field of Classification Search
CPC ..... G03F 7/70033; H05G 2/008; H05G 2/006
See application file for complete search history.

(56) References Cited

U.S. PATENT DOCUMENTS

| 4,723,262 A  * | 2/1988 | Noda  | H05G 2/003 378/119 |
| 7,589,337 B2 * | 9/2009 | Bykanov | H05G 2/001 250/495.1 |

(Continued)

FOREIGN PATENT DOCUMENTS

| JP | 2010-149335 A | 7/2010 |
| WO | 2008/143810 A1 | 11/2008 |

(Continued)

OTHER PUBLICATIONS

International Search Report issued in PCT/JP2018/011078; dated Jun. 12, 2018.

(Continued)

*Primary Examiner* — Steven Whitesell Gordon
(74) *Attorney, Agent, or Firm* — Studebaker & Brackett PC

(57) ABSTRACT

A target supply device includes a vibrating element driven by a square wave electric signal and configured to generate a droplet of a target substance by vibrating the target substance to be output from a nozzle through a vibration propagating path; a temperature adjusting mechanism configured to adjust, to a specified temperature, a temperature of a vibration propagating path member including at least part of the vibration propagating path; a droplet detecting unit configured to output a signal containing information on a droplet detection interval indicating a time interval of droplets continuously generated; and a control unit configured to determine, based on the droplet detection interval, an operation specified temperature that is the specified temperature of the vibration propagating path member and an operation duty value that is a duty value of the electric signal used for driving the vibrating element when the droplet is irradiated with the laser beam.

18 Claims, 24 Drawing Sheets

(52) U.S. Cl.
CPC ...... *G03F 7/70508* (2013.01); *G03F 7/70525* (2013.01); *H05G 2/008* (2013.01)

(56) References Cited

U.S. PATENT DOCUMENTS

| | | |
|---|---|---|
| 2006/0192153 A1 | 8/2006 | Bykanov et al. |
| 2009/0014668 A1* | 1/2009 | Vaschenko ............. B82Y 10/00 250/504 R |
| 2013/0234051 A1* | 9/2013 | Rajyaguru ............. H05G 2/005 250/504 R |
| 2014/0151582 A1* | 6/2014 | Rollinger ................ B05B 1/02 250/504 R |
| 2014/0160450 A1* | 6/2014 | Loopstra ............... H05G 2/003 355/30 |
| 2016/0234920 A1* | 8/2016 | Suzuki .................. H05G 2/008 |
| 2017/0209899 A1* | 7/2017 | Hirashita ............ B05B 17/0669 |
| 2017/0215266 A1* | 7/2017 | Hirashita ............... H05G 2/006 |
| 2018/0288863 A1 | 10/2018 | Fujimaki et al. |
| 2020/0363728 A1* | 11/2020 | Nakano ................... H05G 2/00 |

FOREIGN PATENT DOCUMENTS

| | | |
|---|---|---|
| WO | 2016/072431 A1 | 5/2016 |
| WO | 2017/130323 A1 | 8/2017 |

OTHER PUBLICATIONS

International Preliminary Report on Patentability and Written Opinion issued in PCT/JP2018/011078; dated Sep. 22, 2020.

* cited by examiner

TARGET SUPPLY DEVICE, EXTREME ULTRAVIOLET LIGHT GENERATING APPARATUS, AND ELECTRONIC DEVICE MANUFACTURING METHOD

CROSS-REFERENCE TO RELATED APPLICATIONS

The present application is a continuation application of International Application No. PCT/JP2018/011078 filed on Mar. 20, 2018. The content of the application is incorporated herein by reference in its entirety.

BACKGROUND

1. Technical Field

The present disclosure relates to a target supply device, an extreme ultraviolet light generating apparatus, and an electronic device manufacturing method.

2. Related Art

Recently, miniaturization of semiconductor processes has involved increasing miniaturization of transfer patterns for use in photolithography of the semiconductor processes. In the next generation, microfabrication at 20 nm or less will be required. Thus, development of an exposure apparatus is expected including a combination of an apparatus for generating extreme ultraviolet (EUV) light having a wavelength of about 13 nm and reduced projection reflection optics.

Three types of EUV light generating apparatuses have been proposed: a laser produced plasma (LPP) apparatus using plasma generated by irradiating a target substance with a laser beam, a discharge produced plasma (DPP) apparatus using plasma generated by electric discharge, and a synchrotron radiation (SR) apparatus using synchrotron radiation light.

LIST OF DOCUMENTS

Patent Documents

Patent Document 1: International Publication No. WO2017/130323
Patent Document 2: US Published Patent Application No. 2006/0192153
Patent Document 3: International Publication No. WO2016/072431
Patent Document 4: Japanese Unexamined Patent Application Publication No. 2010-149335

SUMMARY

A target supply device according to one aspect of the present disclosure includes a nozzle from which a target substance is output; a vibrating element driven by a square wave electric signal and configured to generate a droplet of the target substance by vibrating the target substance to be output from the nozzle through a vibration propagating path; a temperature adjusting mechanism configured to adjust, to a specified temperature, a temperature of a vibration propagating path member including at least part of the vibration propagating path; a droplet detecting unit configured to detect the droplet generated by driving the vibrating element and to output a signal containing information on a droplet detection interval indicating a time interval of droplets that are continuously generated; and a control unit configured to determine, based on the droplet detection interval, an operation specified temperature that is the specified temperature of the vibration propagating path member when the droplet is irradiated with a laser beam, and an operation duty value that is a duty value of the electric signal used for driving the vibrating element when the droplet is irradiated with the laser beam.

An extreme ultraviolet light generating apparatus according to one aspect of the present disclosure that irradiates a target substance with a laser beam to generate plasma from which extreme ultraviolet light is generated, includes a chamber into which the laser beam is introduced; a nozzle from which a target substance is output into the chamber; a vibrating element driven by a square wave electric signal and configured to generate a droplet of the target substance by vibrating the target substance to be output from the nozzle through a vibration propagating path; a temperature adjusting mechanism configured to adjust, to a specified temperature, a temperature of a vibration propagating path member including at least part of the vibration propagating path; a droplet detecting unit configured to detect the droplet generated by driving the vibrating element and to output a signal containing information on a droplet detection interval indicating a time interval of droplets that are continuously generated; and a control unit configured to determine, based on the droplet detection interval, an operation specified temperature that is the specified temperature of the vibration propagating path member when the droplet is irradiated with the laser beam, and an operation duty value that is a duty value of the electric signal used for driving the vibrating element when the droplet is irradiated with the laser beam.

An electronic device manufacturing method according to one aspect of the present disclosure includes irradiating a target substance with a laser beam to generate plasma from which extreme ultraviolet light is generated, with an extreme ultraviolet light generating apparatus. The extreme ultraviolet light generating apparatus includes a chamber into which the laser beam is introduced, a nozzle from which the target substance is output into the chamber, a vibrating element driven by a square wave electric signal and configured to generate a droplet of the target substance by vibrating the target substance to be output from the nozzle through a vibration propagating path, a temperature adjusting mechanism configured to adjust, to a specified temperature, a temperature of a vibration propagating path member including at least part of the vibration propagating path, a droplet detecting unit configured to detect the droplet generated by driving the vibrating element and to output a signal containing information on a droplet detection interval indicating a time interval of droplets that are continuously generated, and a control unit configured to determine, based on the droplet detection interval, an operation specified temperature that is the specified temperature of the vibration propagating path member when the droplet is irradiated with the laser beam, and an operation duty value that is a duty value of the electric signal used for driving the vibrating element when the droplet is irradiated with the laser beam. The method further includes outputting the extreme ultraviolet light to an exposure apparatus; and exposing the extreme ultraviolet light onto a photosensitive substrate within the exposure apparatus to manufacture an electronic device.

BRIEF DESCRIPTION OF THE DRAWINGS

With reference to the accompanying drawings, some embodiments of the present disclosure will be described below merely by way of example.

DESCRIPTION OF EMBODIMENTS

Figure 1:
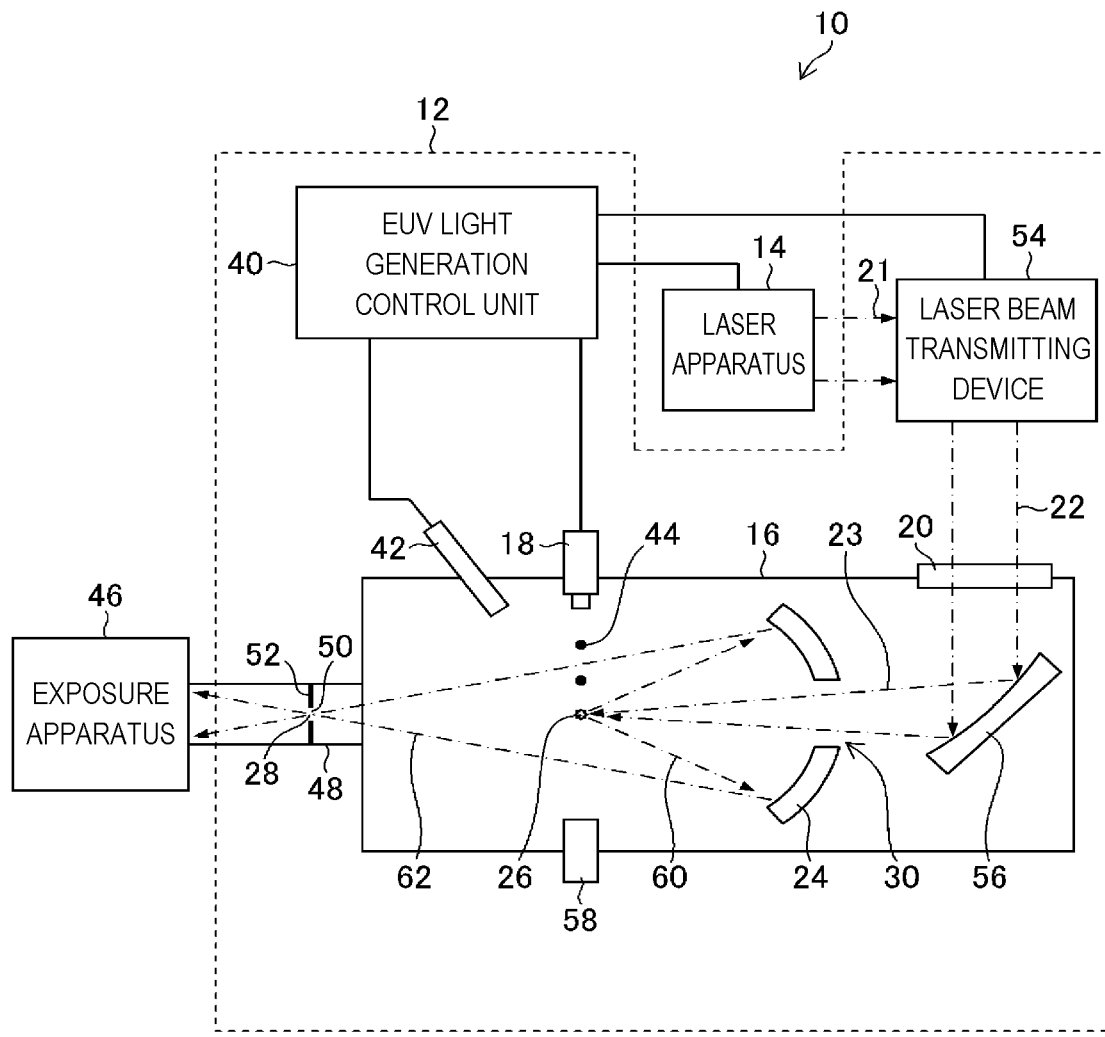
FIG. 1 schematically shows a configuration of an exemplary LPP EUV light generating system.

<Contents>
1. Overall description of extreme ultraviolet light generating system
  1.1 Configuration
  1.2 Operation
2. Terms
3. EUV light generating apparatus including target supply device
  3.1 Configuration
  3.2 Operation
4. Light emission trigger signal control system of laser apparatus
  4.1 Configuration
  4.2 Operation
  4.3 Poor generation of droplet
  4.4 Duty adjustment to improve poor connection of droplets
    4.4.1 Configuration
    4.4.2 Operation
    4.4.3 Exemplary duty adjustment
5. Problem
6. Embodiment 1
  6.1 Configuration
  6.2 Operation
  6.3 Exemplary control including processes of change of piezoelectric unit temperature and duty adjustment
  6.4 Effect
7. Embodiment 2
  7.1 Configuration
  7.2 Operation
  7.3 Effect
8. Embodiment 3
  8.1 Configuration
  8.2 Operation
  8.3 Effect
9. Embodiment 4
  9.1 Configuration
  9.2 Operation
  9.3 Effect
10. Embodiment 5
  10.1 Configuration
  10.2 Operation
  10.3 Exemplary control including processes of change of nozzle temperature and duty adjustment
  10.4 Effect
11. Modifications of embodiments
  11.1 Modification 1
  11.2 Modification 2
12. Exemplary structure 1 of piezoelectric unit
  12.1 Configuration
  12.2 Operation
13. Exemplary structure 2 of piezoelectric unit
  13.1 Configuration
  13.2 Operation
14. Laser apparatus 15. Exemplary electronic device manufacturing method using EUV light generating apparatus Now, with reference to the drawings, embodiments of the present disclosure will be described in detail. The embodiments described below illustrate some examples of the present disclosure, and do not limit contents of the present disclosure. Also, all configurations and operations described in the embodiments are not necessarily essential as configurations and operations of the present disclosure. The same components are denoted by the same reference numerals, and overlapping descriptions are omitted.

1. Overall Description of Extreme Ultraviolet Light Generating System

1.1 Configuration

FIG. 1 schematically shows a configuration of an exemplary LPP EUV light generating system 10. An EUV light generating apparatus 12 may be used together with at least one laser apparatus 14. In the present application, a system including the EUV light generating apparatus 12 and the laser apparatus 14 is referred to as the EUV light generating system 10. As shown in FIG. 1 and described below in detail, the EUV light generating apparatus 12 includes a chamber 16 and a target supply unit 18.

The chamber 16 is a sealable container. The target supply unit 18 supplies a target substance into the chamber 16, and is, for example, mounted to extend through a wall of the chamber 16. A material of the target substance may include tin, terbium, gadolinium, lithium, xenon, or any combinations of two or more thereof, but is not limited thereto.

The wall of the chamber 16 has at least one through hole. The through hole is blocked by a window 20 through which a pulse laser beam 22 output from the laser apparatus 14 passes. Inside the chamber 16, for example, an EUV light condensing mirror 24 having a spheroidal reflective surface is arranged. The EUV light condensing mirror 24 has first and second focal points. On a surface of the EUV light condensing mirror 24, a multilayer reflective film including, for example, alternately stacked molybdenum and silicon is formed. The EUV light condensing mirror 24 is arranged so that, for example, the first focal point is located in a plasma generating region 26 and the second focal point is located at an intermediate focusing point (IF) 28. A through-hole 30 is provided at a center of the EUV light condensing mirror 24, and a pulse laser beam 23 passes through the through-hole 30.

The EUV light generating apparatus 12 includes an EUV light generation control unit 40, a target sensor 42, and the like. The target sensor 42 detects one or several of presence, a trajectory, a position, and a speed of a target 44. The target sensor 42 may have an imaging function.

The EUV light generating apparatus 12 includes a connecting portion 48 that provides communication between an inside of the chamber 16 and an inside of an exposure apparatus 46. The connecting portion 48 includes therein a wall 52 having an aperture 50. The wall 52 is arranged so that the aperture 50 is located at the second focal point of the EUV light condensing mirror 24.

The EUV light generating apparatus 12 further includes a laser beam transmitting device 54, a laser beam condensing mirror 56, a target collecting unit 58 for collecting the target 44, and the like. The laser beam transmitting device 54 includes an optical element for defining a transmission state of a laser beam, and an actuator for adjusting a position, an orientation, and the like of the optical element. The target collecting unit 58 is arranged on an extended line in a traveling direction of the target 44 output into the chamber 16.

The laser apparatus 14 may be a master oscillator power amplifier (MOPA) system. The laser apparatus 14 includes a master oscillator (not shown), an optical isolator (not shown), and a plurality of $CO_2$ laser amplifiers (not shown). A wavelength of a laser beam output from the master oscillator is, for example, 10.59 μm, and a repetition frequency of pulse oscillation is, for example, 100 kHz.

1.2 Operation

With reference to FIG. 1, an operation of the exemplary LPP EUV light generating system 10 will be described. The inside of the chamber 16 is maintained at pressure lower than atmospheric pressure, and may be preferably vacuum. Alternatively, gas having high EUV light transmittance exists in the chamber 16. The gas existing in the chamber 16 may be, for example, hydrogen gas.

A pulse laser beam 21 output from the laser apparatus 14 passes through the laser beam transmitting device 54, and enters, as the pulse laser beam 22, the chamber 16 through the window 20. The pulse laser beam 22 travels along at least one laser beam path in the chamber 16, and is reflected by the laser beam condensing mirror 56 and applied to the at least one target 44 as the pulse laser beam 23.

The target supply unit 18 outputs the target 44 made of the target substance toward the plasma generating region 26 in the chamber 16. The target supply unit 18 forms droplets by, for example, a continuous jet scheme. In the continuous jet scheme, a nozzle is vibrated to provide periodic vibration to a flow of the target substance ejected in a jet form through a nozzle hole, thereby periodically separating the target substance. The separated target substance can form a free interface by its own surface tension, thereby forming a droplet.

The target 44 is irradiated with at least one pulse included in the pulse laser beam 23. Plasma is generated from the target 44 irradiated with the pulse laser beam, and radiates radiation light 60. EUV light 62 included in the radiation light 60 is selectively reflected by the EUV light condensing mirror 24. The EUV light 62 reflected by the EUV light condensing mirror 24 is condensed at the intermediate focusing point 28 and output to the exposure apparatus 46. A single target 44 may be irradiated with a plurality of pulses included in the pulse laser beam 23.

The EUV light generation control unit 40 collectively controls the entire EUV light generating system 10. The EUV light generation control unit 40 processes a detection result from the target sensor 42. The EUV light generation control unit 40 controls, based on the detection result from the target sensor 42, output timing of the target 44, an output direction of the target 44, and the like. Further, the EUV light generation control unit 40 controls oscillation timing of the laser apparatus 14, a traveling direction of the pulse laser beam 22, a focusing position of the pulse laser beam 23, and the like. Such various kinds of control are merely exemplary, and different control may be added as required.

2. Terms

"Target" is an object irradiated with a laser beam introduced into the chamber. Plasma is generated from the target irradiated with the laser beam and radiates EUV light. The target is a plasma generation source.

"Droplet" is a form of a target supplied into the chamber. The droplet may be the target in the form of droplet having a substantially spherical shape by surface tension of a melted target substance. "Droplet trajectory" is a path on which a droplet travels in the chamber.

"Pulse laser beam" may be a laser beam including a plurality of pulses.

"Laser beam" is not limited to a pulse laser beam but may be a laser beam in general.

"Laser beam path" is an optical path of a laser beam.

"$CO_2$" is carbon dioxide.

"Plasma light" is radiation light radiated from plasma of a target. This radiation light includes EUV light.

"EUV light" stands for "extreme ultraviolet light". "Extreme ultraviolet light generating apparatus" is also referred to as "EUV light generating apparatus".

"Piezoelectric element" is synonymous with a dielectric element. The piezoelectric element is simply referred to as "piezoelectric" in some cases. The piezoelectric element is a form of a vibrating element.

"Duty" is a ratio of a high potential side voltage time (Th) relative to one pulse period (T) in a square wave electric signal applied to a vibrating element. The duty is herein expressed in percentage [%]. A value of the duty is referred to as duty value.

Figure 2:
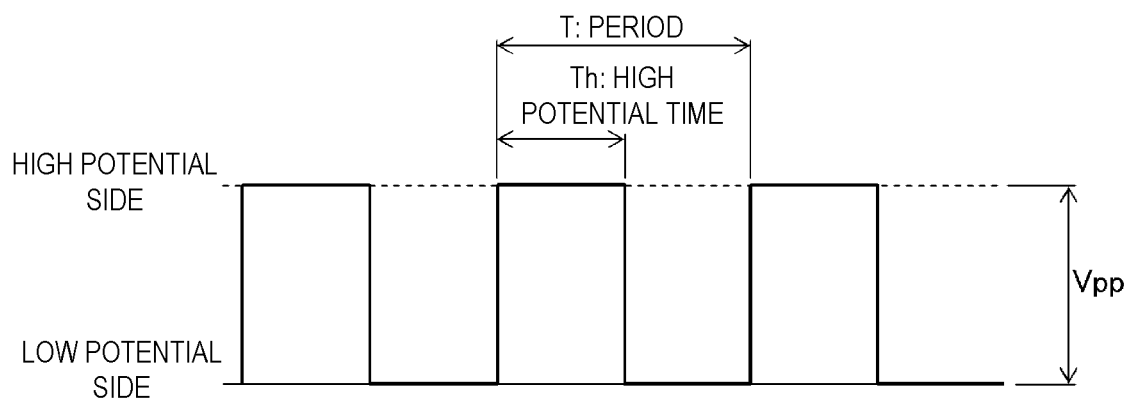
FIG. 2 is a waveform diagram of an exemplary voltage waveform of a square wave.

FIG. 2 shows an exemplary voltage waveform of a square wave. The horizontal axis represents time, and the vertical axis represents voltage. The duty [%] is (Th/T)*100. "Vpp" in FIG. 2 is a difference between a high potential side voltage and a low potential side voltage. Vpp is referred to as applied voltage.

3. EUV Light Generating Apparatus Including Target Supply Device

3.1 Configuration

Figure 3:
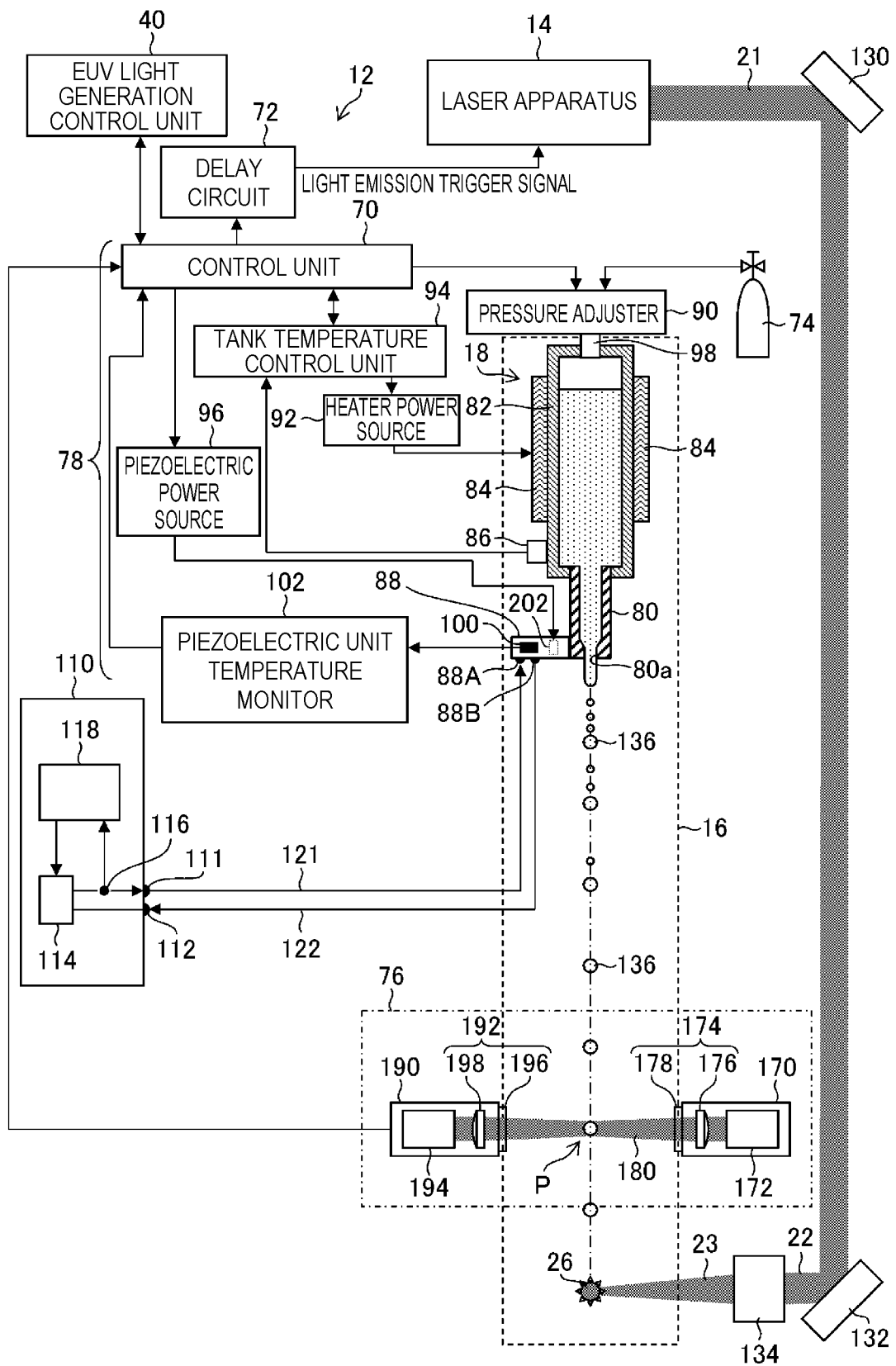
FIG. 3 schematically shows a configuration of an EUV light generating apparatus including a target supply device.

FIG. 3 schematically shows a configuration of an EUV light generating apparatus including a target supply device. The EUV light generating apparatus 12 includes a target supply unit 18, a control unit 70, a delay circuit 72, an inert gas supply unit 74, and a droplet detecting device 76.

The target supply unit 18 includes a nozzle 80 from which a target substance is output, a tank 82 that holds the target substance, a heater 84, a tank temperature sensor 86, a piezoelectric unit 88, and a pressure adjuster 90.

The target supply unit 18 also includes a heater power source 92, a tank temperature control unit 94, a piezoelectric power source 96, a piezoelectric unit temperature sensor 100, a piezoelectric unit temperature monitor 102, and a chiller unit 110.

A target supply device 78 includes the target supply unit 18, the control unit 70, the heater power source 92, the tank temperature control unit 94, the piezoelectric power source 96, the piezoelectric unit temperature sensor 100, and the piezoelectric unit temperature monitor 102. The target supply device 78 may include the droplet detecting device 76 and the chiller unit 110.

The tank 82 is formed in a hollow tubular shape. The hollow tank 82 holds the target substance. At least an inside of the tank 82 is made of a material less reactive with the target substance. When tin is used as an example of the target substance, materials less reactive with tin include, for example, SiC, $SiO_2$, $Al_2O_3$, molybdenum, tungsten, and tantalum.

The heater 84 and the tank temperature sensor 86 are fixed to the tank 82. The heater 84 is fixed to an outer side surface of the tank 82. The heater 84 fixed to the tank 82 heats the tank 82. The heater 84 is connected to the heater power source 92.

The heater power source 92 supplies power to the heater 84. The heater power source 92 is connected to the tank temperature control unit 94. The tank temperature control unit 94 may be connected to the control unit 70 or included in the control unit 70. The power supplied from the heater power source 92 to the heater 84 is controlled by the tank temperature control unit 94.

The tank temperature sensor 86 is fixed to the outer side surface of the tank 82. The tank temperature sensor 86 is connected to the tank temperature control unit 94. The tank temperature sensor 86 detects a temperature of the tank 82 and outputs tank temperature information to the tank temperature control unit 94. The tank temperature control unit 94 can adjust the power supplied to the heater 84 based on the tank temperature information output from the tank temperature sensor 86. The tank temperature control unit 94 outputs a heater power source control signal to the heater power source 92.

A tank temperature adjusting mechanism including the heater 84 and the heater power source 92 can adjust the temperature of the tank 82 based on the heater power source control signal from the tank temperature control unit 94.

The pressure adjuster 90 is arranged on a pipe 98 between the inert gas supply unit 74 and the tank 82. The pipe 98 can provide communication between the target supply unit 18 including the tank 82 and the pressure adjuster 90. The pipe 98 may be covered with a heat insulating material (not shown) or the like. A heater (not shown) is arranged on the pipe 98. A temperature in the pipe 98 may be maintained equal to the temperature in the tank 82 of the target supply unit 18.

The inert gas supply unit 74 includes a gas tank filled with inert gas such as helium or argon. The inert gas supply unit 74 supplies the inert gas into the tank 82 through the pressure adjuster 90. In this example, argon is used as the inert gas.

The pressure adjuster 90 may include an electromagnetic valve (not shown), a pressure sensor (not shown), and the like for supplying and exhausting air. The pressure adjuster 90 uses the pressure sensor (not shown) to detect pressure in the tank 82. The pressure adjuster 90 is coupled to an exhaust pump (not shown). The pressure adjuster 90 operates the exhaust pump (not shown) to exhaust gas from the tank 82.

The pressure adjuster 90 can increase or decrease the pressure in the tank 82 by supplying gas into the tank 82 or exhausting gas from the tank 82. The pressure adjuster 90 is connected to the control unit 70. The pressure adjuster 90 outputs a detection signal of detected pressure to the control unit 70. The pressure adjuster 90 receives a control signal output from the control unit 70.

The control unit 70 supplies to the pressure adjuster 90, based on the detection signal output from the pressure adjuster 90, a pressure instruction signal for controlling operation of the pressure adjuster 90 so that the pressure in the tank 82 reaches target pressure. The pressure adjuster 90 supplies gas into the tank 82 or exhausts gas from the tank 82 based on the pressure instruction signal from the control unit 70. The pressure adjuster 90 can supply gas into the tank 82 or exhaust gas from the tank 82 to adjust the pressure in the tank 82 to the target pressure.

The nozzle 80 has a nozzle hole 80a through which the target substance is output. The target substance output through the nozzle hole 80a may be, for example, liquid tin.

The nozzle 80 is provided on a bottom surface of the tubular tank 82. The nozzle 80 is arranged inside the chamber 16 through a target supply hole (not shown) of the chamber 16. The target supply hole of the chamber 16 is blocked when the target supply unit 18 is arranged. When the target supply unit 18 is arranged to block the target supply hole of the chamber 16, the inside of the chamber 16 can be isolated from atmosphere.

One end of the nozzle 80 is fixed to the hollow tank 82. The other end of the nozzle 80 has the nozzle hole 80a. The nozzle hole 80a is located inside the chamber 16. Both the tank 82 and the nozzle 80 may be located inside the chamber 16. Not limited to this example, the tank 82 on the one end side of the nozzle 80 may be partially or entirely located outside the chamber 16, and the nozzle hole 80a on the other end side of the nozzle 80 may be located inside the chamber 16.

The plasma generating region 26 inside the chamber 16 is located on an extended line of a central axis of the nozzle hole 80a. The insides of the tank 82, the nozzle 80, and the chamber 16 communicate with each other. At least the inside of the nozzle 80 is made of a material less reactive with the target substance.

The nozzle hole 80a is formed in such a shape that the melted target substance is ejected in a jet form into the chamber 16.

The piezoelectric unit 88 is fixed to the nozzle 80. The piezoelectric unit 88 includes a piezoelectric element 202. The piezoelectric element 202 may be a single layer piezoelectric element. Alternatively, the piezoelectric element 202 may be a multilayer piezoelectric element. The piezoelectric element 202 is connected to the piezoelectric power source 96.

When a square wave piezoelectric drive signal having a predetermined frequency is applied from the piezoelectric power source 96 to the piezoelectric element 202, tin droplets are continuously output from the nozzle 80. Some of the droplets output from the nozzle 80 are connected while falling to form a droplet 136 having a certain mass.

The piezoelectric unit 88 and the piezoelectric power source 96 may constitute a droplet forming mechanism that provides vibration necessary for forming the droplet 136 to the nozzle 80.

The piezoelectric power source 96 supplies power to the piezoelectric element 202. The piezoelectric power source 96 is connected to the control unit 70. The control unit 70 controls the power supplied from the piezoelectric power source 96 to the piezoelectric element 202.

The piezoelectric unit temperature sensor 100 measures a temperature of the piezoelectric unit 88. The temperature of the piezoelectric unit 88 is referred to as "piezoelectric unit temperature". The piezoelectric unit 88 constitutes part of a vibration propagating path, and piezoelectric unit temperature information directly or indirectly indicates a temperature of the vibration propagating path. In the configuration of the apparatus in FIG. 3, the piezoelectric unit temperature is used as the information indicating the temperature of the vibration propagating path.

The piezoelectric unit temperature sensor 100 is fixed to the piezoelectric unit 88. The piezoelectric unit temperature sensor 100 is connected to the piezoelectric unit temperature monitor 102.

The piezoelectric unit temperature monitor 102 monitors the piezoelectric unit temperature information obtained from the piezoelectric unit temperature sensor 100. "Monitoring" includes monitoring continuously or at appropriate time intervals. The piezoelectric unit temperature monitor 102 may include a display device or an indicator configured to output the piezoelectric unit temperature information in a visualized manner. The piezoelectric unit temperature monitor 102 is connected to the control unit 70.

The piezoelectric unit 88 has a coolant inlet 88A and a coolant outlet 88B. The piezoelectric unit 88 has coolant passages extending from the coolant inlet 88A to the coolant outlet 88B. The coolant passages (not shown in FIG. 3) in the piezoelectric unit 88 are denoted by reference numeral 303 in FIGS. 25 to 28. An exemplary configuration of the piezoelectric unit 88 will be described later with reference to FIGS. 25 to 28. The piezoelectric unit 88 is an example of a vibrating unit.

The chiller unit 110 is a coolant circulating device configured to supply, to the piezoelectric unit 88, coolant as refrigerant for cooling the piezoelectric unit 88. A coolant outlet 111 of the chiller unit 110 is connected through a coolant supply channel 121 to the coolant inlet 88A of the piezoelectric unit 88. The coolant inlet 112 of the chiller unit 110 is connected through a coolant return channel 122 to the coolant outlet 88B of the piezoelectric unit 88.

The chiller unit 110 includes a coolant heating and cooling unit 114, a coolant temperature sensor 116, and a coolant temperature control unit 118. The coolant heating and cooling unit 114 is a temperature adjusting device having a coolant heating function and a coolant cooling function. The coolant heating and cooling unit 114 includes a heater and a cooler (not shown). The cooler includes a heat exchanger. The coolant heating and cooling unit 114 is connected to the coolant temperature control unit 118.

The coolant temperature sensor 116 measures a coolant temperature on a coolant outlet side of the chiller unit 110. The coolant temperature sensor 116 is arranged on an outlet side channel connecting the coolant heating and cooling unit 114 and the coolant outlet 111. The coolant temperature sensor 116 is connected to the coolant temperature control unit 118.

The coolant temperature control unit 118 controls operation of the coolant heating and cooling unit 114. The coolant temperature control unit 118 transmits a coolant temperature control signal to the coolant heating and cooling unit 114 based on coolant temperature information output from the coolant temperature sensor 116.

The droplet detecting device 76 may be part or the entire of the target sensor 42 described with reference to FIG. 1. The droplet detecting device 76 detects a droplet 136 output into the chamber 16.

The droplet detecting device 76 includes a light source unit 170 and a light receiving unit 190. The light source unit 170 includes a light source 172 and an illumination optical system 174. The light source unit 170 is arranged to illuminate a droplet at a predetermined position P on a droplet trajectory between the nozzle 80 of the target supply unit 18 and the plasma generating region 26. The light source 172 may be a continuous-wave (CW) laser beam source. The illumination optical system 174 includes a light condensing lens 176 and a window 178. The window 178 is arranged on the wall of the chamber 16.

A beam diameter of a continuous laser beam with which the droplet 136 is irradiated may be sufficiently larger than a diameter of the droplet 136. The diameter of the droplet 136 is, for example, 20 μm.

The light source unit 170 and the light receiving unit 190 are arranged to face each other with a traveling path of the droplet 136 output into the chamber 16 therebetween. The light source unit 170 and the light receiving unit 190 may face each other in a direction orthogonal to the traveling path of the droplet 136.

When the droplet 136 traveling on the droplet trajectory reaches the predetermined position P, the droplet 136 can be irradiated with illumination light 180 emitted from the light source unit 170.

The light receiving unit 190 includes a light receiving optical system 192 and an optical sensor 194. The light receiving unit 190 is arranged to receive the illumination light 180 output from the light source unit 170. The light receiving optical system 192 includes a window 196 and a light condensing lens 198. The light receiving optical system 192 may be an optical system such as a collimator, and includes an optical element such as a lens. The window 196 is arranged on the wall of the chamber 16. The light receiving optical system 192 guides, to the optical sensor 194, a continuous laser beam emitted from the light source unit 170.

The optical sensor 194 is a light receiving element including one or more light receiving surfaces. The optical sensor 194 may be any of a photodiode, a photodiode array, an avalanche photodiode, a photomultiplier, a multi-pixel photon counter, and an image intensifier. The optical sensor 194 detects intensity of a continuous laser beam guided by the light receiving optical system 192. The optical sensor 194 is connected to the control unit 70. The optical sensor 194 supplies a detection signal of the detected intensity to the control unit 70.

When the droplet 136 passes through the predetermined position P on the droplet trajectory, part of the continuous laser beam is shielded by the droplet 136, and the intensity of light received by the light receiving unit 190 decreases. The light receiving unit 190 can output, to the control unit 70, a detection signal in accordance with the intensity decrease due to the passing of the droplet 136.

The detection signal output from the light receiving unit 190 is transmitted to the control unit 70. The control unit 70 may generate, from the detection signal, a passing timing signal indicating passing timing of the droplet. "Passing timing" is timing at which the droplet 136 passes through the predetermined position P on the target trajectory. For example, the control unit 70 may generate a passing timing signal of a high level in a duration in which an amount of light received by the optical sensor 194 is equal to or smaller than a predetermined threshold. Alternatively, the droplet detecting device 76 may generate a passing timing signal. Specifically, the droplet detecting device 76 may output a passing timing signal synchronous with the passing timing of the droplet 136, and input the passing timing signal to the control unit 70. The droplet detecting device 76 is an example of a droplet detecting unit.

The control unit 70 can detect the timing at which the droplet 136 is detected at the predetermined position P based on the passing timing signal from the droplet detecting device 76. In particular, the control unit 70 can detect the timing at which the droplet 136 passes through the predetermined position P on the droplet trajectory.

The passing timing signal is input through the control unit 70 to the delay circuit 72. The delay circuit 72 is connected to a signal line through which the control unit 70 sets a delay time of the delay circuit 72. An output from the delay circuit 72 is input as a light emission trigger signal to the laser apparatus 14.

The EUV light generating apparatus 12 includes a first high reflective mirror 130, a second high reflective mirror 132, and a laser beam condensing optical system 134. The laser beam transmitting device 54 described with reference to FIG. 1 includes the first high reflective mirror 130 and the second high reflective mirror 132. The laser beam condensing optical system 134 includes the laser beam condensing mirror 56 described with reference to FIG. 1.

The chamber 16 of the EUV light generating apparatus 12 is formed in, for example, a hollow spherical shape or tubular shape. A direction of a central axis of the tubular chamber 16 may be a direction in which the EUV light 62 is guided to the exposure apparatus 46. The chamber 16 includes an exhaust device (not shown) and a pressure sensor (not shown).

The EUV light generation control unit 40 communicates signals with an exposure apparatus control unit (not shown) as a control unit of the exposure apparatus 46. The EUV light generation control unit 40 collectively controls operation of the entire EUV light generating system 10 based on an instruction from the exposure apparatus 46. The EUV light generation control unit 40 communicates control signals with the laser apparatus 14. Thus, the EUV light generation control unit 40 controls operation of the laser apparatus 14.

The EUV light generation control unit 40 communicates control signals with an actuator (not shown) of each of the laser beam transmitting device 54 and the laser beam condensing optical system 134. Thus, the EUV light generation control unit 40 adjusts a traveling direction and a focusing position of each of the pulse laser beams 21, 22, and 23.

The EUV light generation control unit 40 communicates control signals with the control unit 70 of the target supply device 78. Thus, the EUV light generation control unit 40 controls operation of the target supply device 78 and the laser apparatus 14.

In the present disclosure, the EUV light generation control unit 40, the control unit 70, and the tank temperature control unit 94, as well as piezoelectric unit temperature control units 150, 151 and a nozzle temperature control unit 152 described later, and other control devices and processing units can be achieved by hardware and software combination of one or more computers. The computers can include a central processing unit (CPU) and a memory. The software is synonymous with a computer program. The computers conceptually include a programmable controller.

Part or all of processing functions of the EUV light generation control unit 40, the control unit 70, the tank temperature control unit 94, the piezoelectric unit temperature control units 150, 151, the nozzle temperature control unit 152, and other control devices may be achieved by an integrated circuit typified by a field programmable gate array (FPGA) and an application specific integrated circuit (ASIC).

The functions of the plurality of control devices can be achieved by a single control device. In the present disclosure, the control devices may be connected to each other through a communication network such as a local area network or the Internet. In a distributed computing environment, a program unit may be stored in both of local and remote memory storage devices.

3.2 Operation

With reference to FIG. 3, operation of the EUV light generating apparatus 12 will be described. The EUV light generation control unit 40 controls an exhaust device (not shown) so that the inside of the chamber 16 is vacuum. The EUV light generation control unit 40 controls, based on a detected value of a pressure sensor (not shown), exhaust of gas by the exhaust device and supply of gas from a gas supply device (not shown) so that the pressure in the chamber 16 is within a predetermined range.

When receiving a target generation signal from the EUV light generation control unit 40, the control unit 70 controls the heater 84 through the tank temperature control unit 94 so that the target substance in the target supply unit 18 has a predetermined temperature equal to or higher than a melting point. The tank temperature control unit 94 controls the heater power source 92 based on a detected value of the tank temperature sensor 86 under control of the control unit 70. The tank temperature control unit 94 transmits a heater power source control signal to the heater power source 92. The heater power source 92 supplies heater power to the heater 84 based on the heater power source control signal.

For example, tin (Sn), which has a melting point of 232° C., is used as the target substance. The control unit 70 controls the heater 84 so that tin in the target supply unit 18 has, for example, a predetermined temperature in the range of 232° C. to 300° C. As a result, the tin held in the target supply unit 18 melts into liquid. The melted tin corresponds to a form of "liquid target substance".

To discharge the liquid target substance through the nozzle hole 80a, the control unit 70 controls the pressure adjuster 90 so that the pressure in the tank 82 reaches predetermined pressure. The pressure adjuster 90 can increase or decrease the pressure in the tank 82 by supplying gas into the tank 82 or exhausting gas from the tank 82 based on a control signal from the control unit 70. Specifically, the pressure adjuster 90 adjusts, in accordance with an instruction from the control unit 70, the pressure in the tank 82 to a predetermined value so that the droplet 136 reaches the plasma generating region 26 through a predetermined target trajectory at a predetermined target speed.

The predetermined target speed of the droplet 136 may be, for example, in the range of 60 m/s to 120 m/s. The predetermined value of the pressure in the tank 82 may be, for example, in the range of several MPa to 40 MPa. As a result, a jet of the liquid target substance is ejected at the predetermined speed through the nozzle hole 80a.

The control unit 70 transmits an electric signal from the piezoelectric power source 96 to the piezoelectric element 202 and performs duty adjustment so that liquid tin output from the nozzle 80 regularly generates the droplet 136 at a predetermined piezoelectric drive frequency. The duty adjustment will be described later in detail. The duty adjustment is performed to set a duty value appropriate for generation of the droplet 136.

The control unit 70 transmits an electric signal having a predetermined piezoelectric drive frequency and a predetermined duty through the piezoelectric power source 96 to the piezoelectric element 202 so that the liquid tin output from the nozzle 80 generates the droplet 136. Specifically, the control unit 70 transmits a piezoelectric drive voltage waveform signal to the piezoelectric power source 96.

The piezoelectric power source 96 supplies a piezoelectric drive voltage to the piezoelectric element 202 in accordance with an instruction from the control unit 70. When the piezoelectric drive voltage is applied to the piezoelectric element 202, the piezoelectric element 202 is vibrated. The vibration of the piezoelectric element 202 propagates to the nozzle 80, and the liquid target substance is vibrated through the nozzle 80. The jet of the liquid tin output through the nozzle hole 80a travels while splitting into droplets. In this case, the liquid target substance is regularly vibrated to facilitate droplet connection of the droplets, and the droplets are connected to periodically generate droplets 136 having substantially the same volume. Then, the droplets 136 can be supplied to the plasma generating region 26.

When each droplet 136 passes through the predetermined position P on the droplet trajectory between the nozzle hole 80a and the plasma generating region 26, the droplet detecting device 76 generates a detection signal. The detection signal output from the droplet detecting device 76 is transmitted to the control unit 70. The control unit 70 generates a passing timing signal indicating passing timing of the droplet. The passing timing signal is input from the control unit 70 to the delay circuit 72.

The delay circuit 72 generates a light emission trigger signal behind the passing timing signal by a delay time, and inputs the light emission trigger signal to the laser apparatus 14. The delay time of the delay circuit 72 is set so that the light emission trigger signal is input to the laser apparatus 14 before the droplet 136 passes through the predetermined position P and reaches the plasma generating region 26. In other words, the delay time is set so that the droplet 136 is irradiated with a pulse laser beam output from the laser apparatus 14 when the droplet 136 reaches the plasma generating region 26.

The pulse laser beam output from the laser apparatus 14 is guided to the plasma generating region 26 through the first high reflective mirror 130, the second high reflective mirror 132, and the laser beam condensing optical system 134, and applied to the droplet 136. The plasma generating region 26 may correspond to the focusing position of the pulse laser beam.

The piezoelectric unit temperature sensor 100 measures the temperature of the piezoelectric unit 88. The piezoelectric unit temperature information output from the piezoelectric unit temperature sensor 100 is transmitted to the piezoelectric unit temperature monitor 102. The piezoelectric unit temperature monitor 102 monitors the piezoelectric unit temperature.

The control unit 70 can receive the piezoelectric unit temperature information from the piezoelectric unit temperature monitor 102, and determine stability of the piezoelectric unit temperature. A criterion for determining stability may be, for example, whether or not the piezoelectric unit temperature is within an allowable range of a specified temperature ±0.1° C.

The coolant temperature sensor 116 and the coolant temperature control unit 118 included in the chiller unit 110 performs feedback control of the coolant heating and cooling unit 114. The coolant temperature information output from the coolant temperature sensor 116 is transmitted to the coolant temperature control unit 118. The coolant temperature control unit 118 controls the coolant heating and cooling unit 114 so as to eliminate a difference between a target coolant temperature and a temperature detected by the coolant temperature sensor 116 provided on the coolant outlet side. Thus, the coolant temperature at the coolant outlet 111 of the chiller unit 110, that is, the outlet temperature of the chiller unit 110 is maintained at a certain temperature within, for example, an allowable range of the target coolant temperature ±0.1° C.

Figure 4:
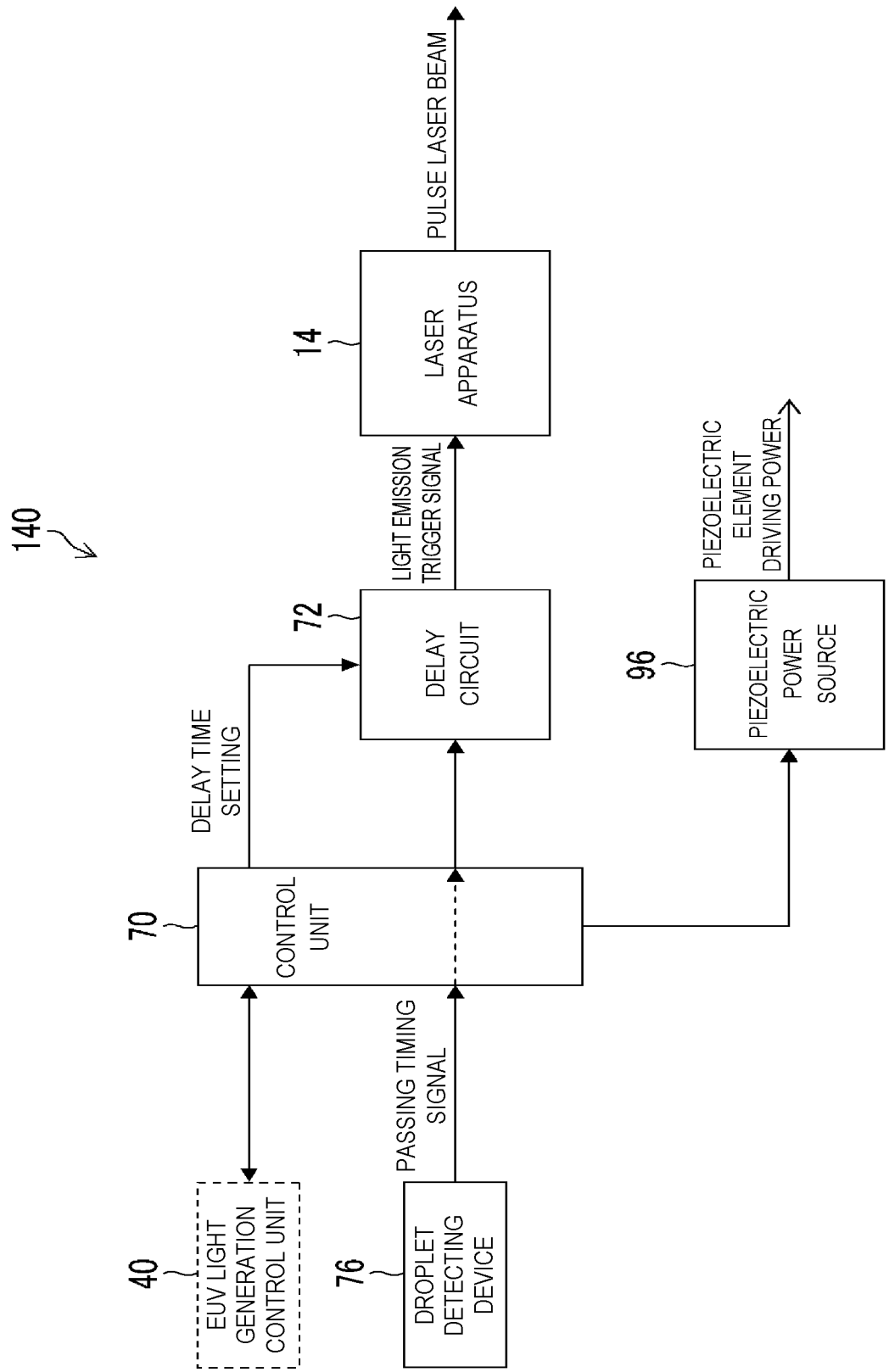
FIG. 4 is a block diagram of a configuration of a control system configured to control a light emission trigger signal of a laser apparatus.

4. Light Emission Trigger Signal Control System of Laser Apparatus 4.1 Configuration FIG. 4 shows an exemplary configuration of a control system configured to control a light emission trigger signal of the laser apparatus. The control system 140 includes the droplet detecting device 76, the control unit 70, and the delay circuit 72. The delay circuit 72 may be configured as part of the control unit 70.

The passing timing signal as an output signal from the droplet detecting device 76 may be input through the control unit 70 to the delay circuit 72. The delay circuit 72 may be connected to a line through which the control unit 70 sets the delay time of the delay circuit 72. An output from the delay circuit 72 may be input to the laser apparatus 14 as a light emission trigger signal.

4.2 Operation

In FIG. 4, when receiving a droplet generation signal from the EUV light generation control unit 40, the control unit 70 transmits, to the delay circuit 72, data for setting a delay time td. The control unit 70 can receive the passing timing signal from the droplet detecting device 76, and input the passing timing signal to the delay circuit 72.

The delay circuit 72 can input, as the light emission trigger signal to the laser apparatus 14, a signal delayed behind the passing timing signal by the delay time td.

Figure 5:
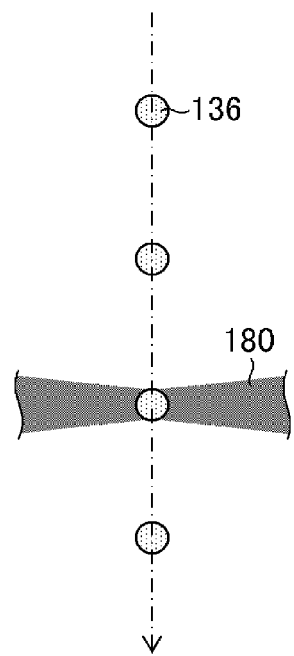
FIG. 5 diagrammatically shows a droplet passing through a detection range of a droplet detecting device when droplets are normally generated.
Figure 6:
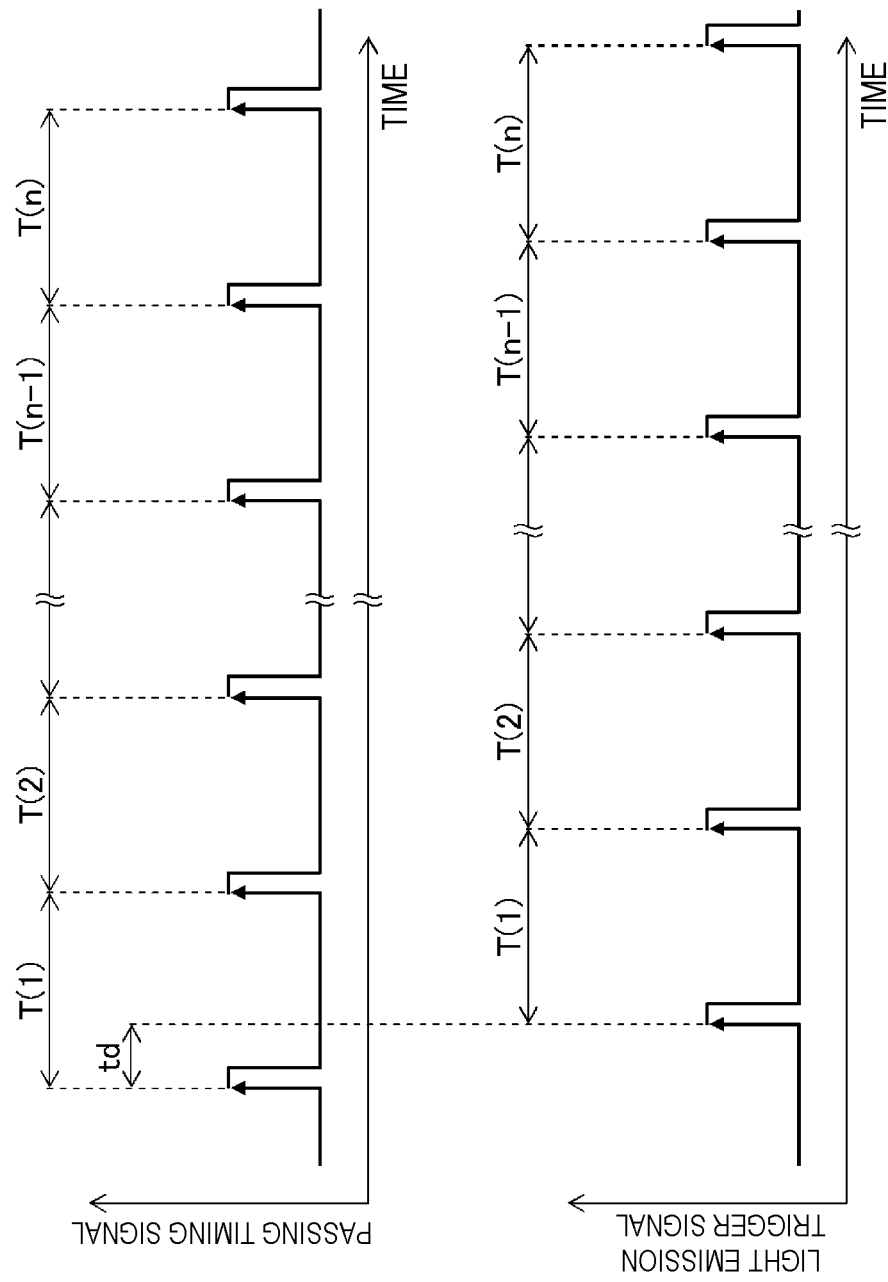
FIG. 6 is an exemplary timing chart of a passing timing signal and a light emission trigger signal obtained when the droplets are normally generated.

FIG. 5 diagrammatically shows a droplet passing through a detection range of the droplet detecting device 76 when droplets are normally generated. FIG. 6 is a timing chart of a passing timing signal and a light emission trigger signal obtained when the droplets are normally generated.

As shown in FIG. 5, when the droplets 136 are normally generated, the droplets 136 that are continuously generated can pass through the detection range of the droplet detecting device 76 at substantially regular intervals. Thus, as shown on the upper side in FIG. 6, time intervals T(1) to T(n) of the passing timing have substantially the same period Tc. The period Tc may be the reciprocal of a predetermined piezoelectric drive frequency fp. In this example, "passing timing" is pulse rise timing of the passing timing signal. The time interval of the passing timing is referred to as "passing timing interval". Thus, the time interval of the signal may be measured from the interval of the pulse rise timing. The passing timing interval is an example of "droplet detection interval". The passing timing signal is an example of a signal containing information on the droplet detection interval.

As shown on the lower side in FIG. 6, the light emission trigger signal can be generated behind the passing timing signal by the delay time td with substantially the same period Tc as that of the passing timing signal. The laser apparatus 14 outputs a laser beam at a substantially constant time interval when the light emission trigger signal shown on the lower side in FIG. 6 is supplied to the laser apparatus 14. Thus, a temperature of an excitation medium is asymptotically substantially constant, and pulse energy of an output laser beam is stabilized.

4.3 Poor Generation of Droplet

Figure 7:
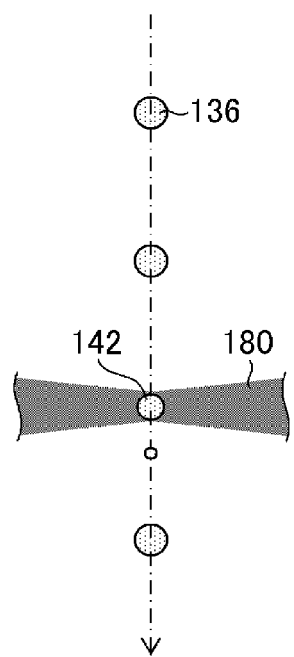
FIG. 7 diagrammatically shows a droplet passing through the detection range of the droplet detecting device when a poorly connected droplet is generated.
Figure 8:
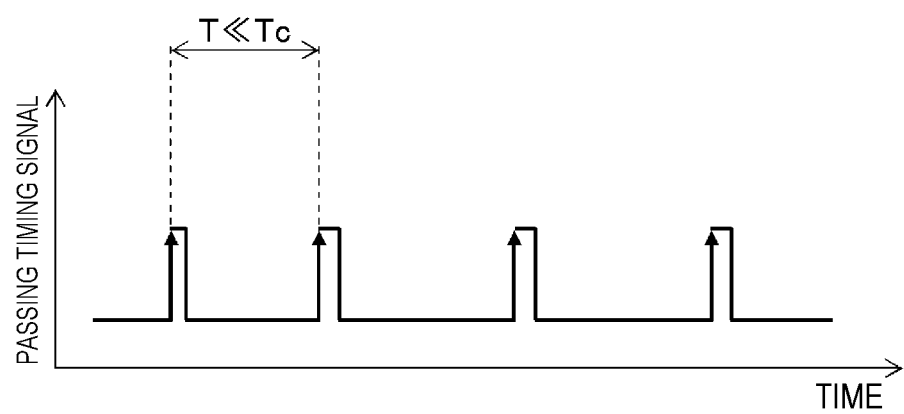
FIG. 8 is an exemplary timing chart of a passing timing signal obtained when the poorly connected droplet is generated.

FIG. 7 diagrammatically shows a droplet passing through the detection range of the droplet detecting device 76 when a poorly connected droplet is generated. FIG. 8 is an exemplary timing chart of a passing timing signal obtained when the poorly connected droplet is generated. In FIG. 8, the second passing timing signal from the left is a signal indicating a poorly connected droplet.

Figure 9:
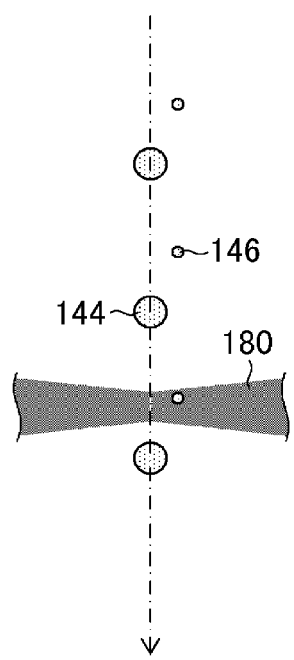
FIG. 9 diagrammatically shows a droplet passing through the detection range of the droplet detecting device when a satellite is generated.
Figure 10:
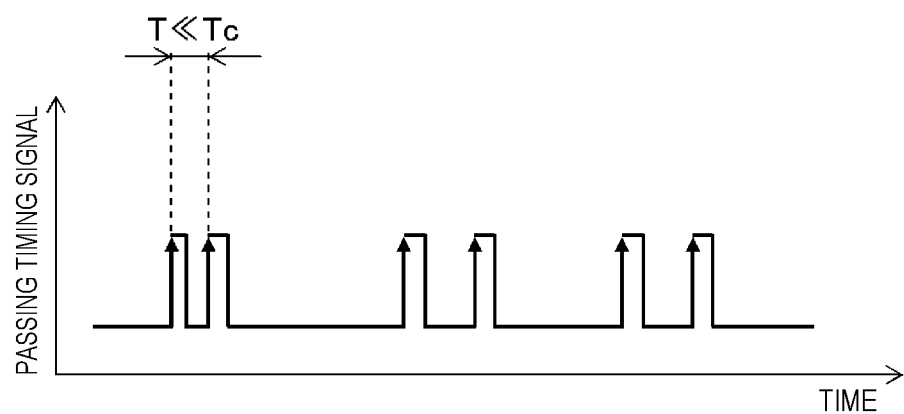
FIG. 10 is an exemplary timing chart of a passing timing signal obtained when the satellite is generated.

FIG. 9 diagrammatically shows a droplet passing through the detection range of the droplet detecting device 76 when a satellite is generated. FIG. 10 is an exemplary timing chart of a passing timing signal obtained when the satellite is generated. In FIG. 10, the second passing timing signal from the left is a signal indicating a satellite. The fourth and sixth passing timing signals from the left are also signals indicating satellites.

Tin droplets are continuously output from the nozzle 80 by increasing the pressure of the gas in the tank 82. When a square wave drive signal having the piezoelectric drive frequency fp is applied from the piezoelectric power source 96 to the piezoelectric element 202, some of the droplets output from the nozzle 80 are connected while falling and then detected by the droplet detecting device 76.

For some reason, a poorly connected droplet 142 may be generated as shown in FIG. 7, or a satellite 146 may be generated near a large droplet 144 as shown in FIG. 9.

When detecting the poorly connected droplet 142 or the satellite 146, the droplet detecting device 76 may generate a passing timing signal at a time interval different from the period Tc.

The delay circuit 72 delays the light emission trigger signal behind the passing timing signal by the delay time td. For example, as illustrated in FIGS. 8 and 10, when the time interval T of the continuous passing timing signals is much shorter than the period Tc, the time interval of the light emission trigger signal input to the laser apparatus 14 is shorter than the period Tc, which may cause the following problems.

[Problem 1]
Pulse energy of the pulse laser beam output from the laser apparatus 14 may decrease. As a result, pulse energy of the EUV light may also decrease.

[Problem 2]
A pulse waveform of the pulse laser beam output from the laser apparatus 14 may change. As a result, the pulse energy of the EUV light may change.

[Problem 3]
The laser apparatus 14 may be broken.

Problems 1 to 3 also apply to a case where, for example, the time interval T is much longer than the period Tc.

4.4 Duty Adjustment to Improve Poor Connection of Droplets

4.4.1 Configuration

Figure 11:
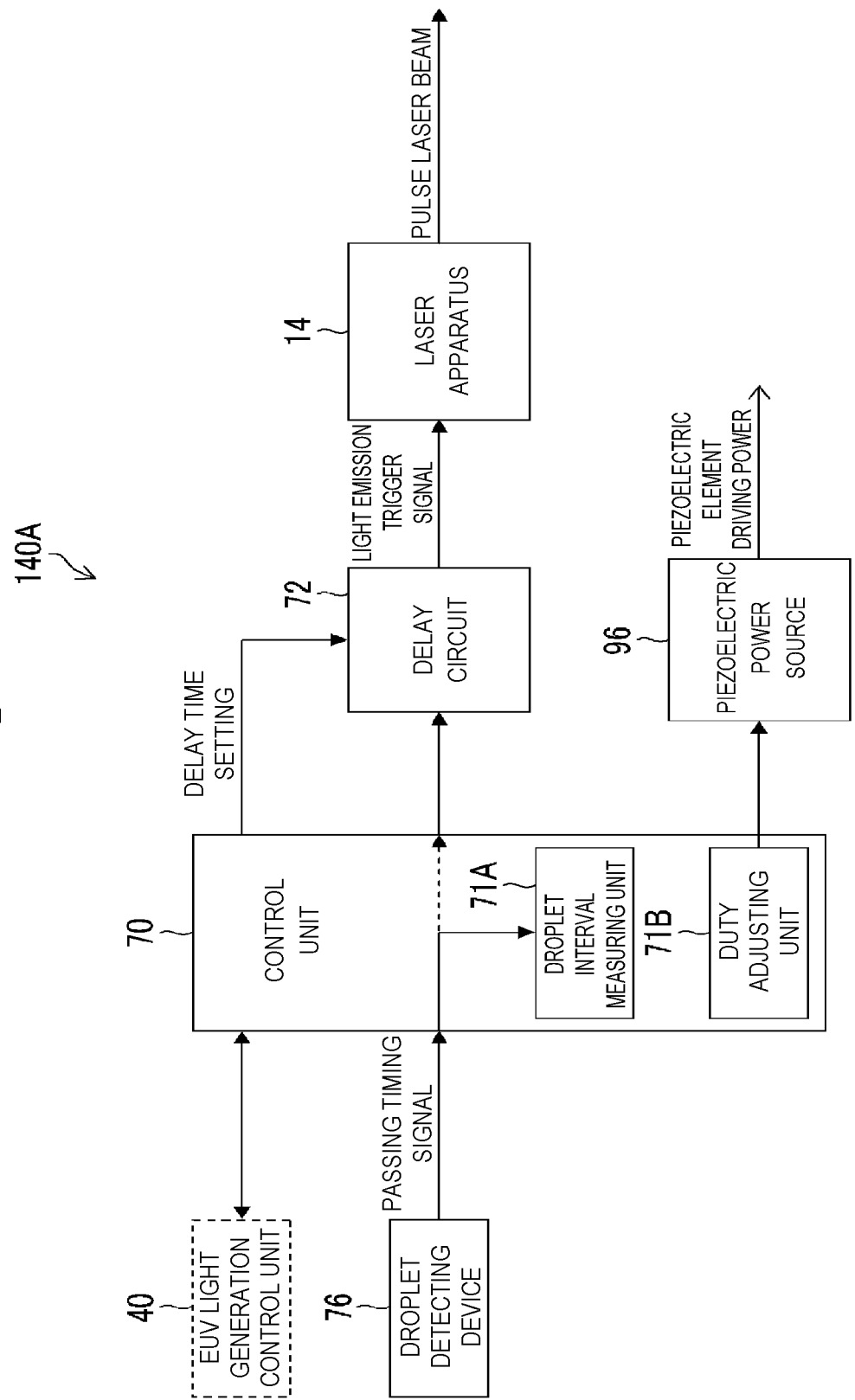
FIG. 11 is a block diagram of an exemplary configuration of a control system having a duty adjustment processing function.

FIG. 11 is a block diagram of an exemplary configuration of a control system having a duty adjustment processing function. A control system 140A in FIG. 11 can be used instead of the control system 140 described with reference to FIG. 3.

The control unit 70 may include a droplet interval measuring unit 71A and a duty adjusting unit 71B. The control unit 70 includes a memory unit (not shown) for storing various kinds of data necessary for control and calculation.

The droplet interval measuring unit 71A may be a circuit configured to measure a passing timing interval of droplets from a passing timing signal generated by the droplet detecting device 76. Alternatively, the droplet interval measuring unit 71A may be a program that is written to calculate a passing timing interval of droplets from a passing timing signal, is stored in the control unit 70, and can be executed by the control unit 70.

The duty adjusting unit 71B may be a circuit configured to output a signal to the piezoelectric power source 96 based on a duty value specified by the control unit 70. Alternatively, the duty adjusting unit 71B may be an external device such as a function generator that can supply a signal waveform to the piezoelectric power source 96 based on a duty value specified by the control unit 70.

4.4.2 Operation

The control unit 70 in FIG. 11 sets a reference value Tcmin of a time interval of a passing timing signal. Tcmin may be stored in a memory device (not shown), or input by an operator. Tcmin may be determined based on a light emission trigger signal interval at which an output of the laser apparatus 14 is unstable. A plurality of reference values Tcmin may be stored in association with a plurality of repetition frequencies of EUV light.

When receiving the passing timing signal, the droplet interval measuring unit 71A measures a passing timing interval T of each droplet.

The control unit 70 compares, with Tcmin, the passing timing interval T measured by the droplet interval measuring unit 71A, and when the passing timing interval T is shorter than Tcmin, the control unit 70 may perform duty adjustment of a piezoelectric drive signal. "Duty adjustment" is adjustment of a duty of a square wave electric signal applied from the piezoelectric power source 96 to the piezoelectric element 202.

When the passing timing interval T is equal to or longer than Tcmin, the control unit 70 may generate a light emission trigger signal. Every time the control unit 70 receives a passing timing interval T measured by the droplet interval measuring unit 71A, the control unit 70 may compare the passing timing interval T with Tcmin. Meanwhile, the EUV light generating apparatus 12 may output EUV light.

When generation of EUV light is temporarily stopped for some reason, the control unit 70 may perform duty adjustment and then generate a light emission trigger signal when restarting the generation of EUV light.

Figure 12:
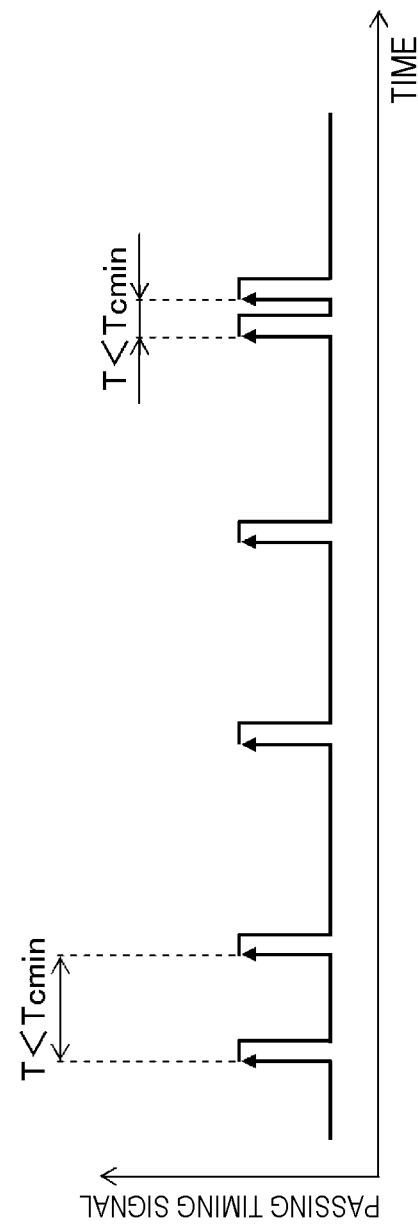
FIG. 12 is an exemplary timing chart of a passing timing signal and a light emission trigger signal obtained when a poorly connected droplet or a satellite is generated.

FIG. 12 is an exemplary timing chart of a passing timing signal and a light emission trigger signal obtained when a poorly connected droplet or a satellite is generated. If a poorly connected droplet or a satellite is generated for some reason, the passing timing interval T may be shorter than Tcmin as shown in FIG. 12.

In the timing chart of the passing timing signal in FIG. 12, the second passing timing signal from the left is a signal indicating detection of passage of a poorly connected droplet. The sixth passing timing signal from the left is a signal indicating detection of passage of a satellite.

The control unit 70 may monitor generation of a poorly connected droplet or a satellite by determining that T is shorter than Tcmin.

Figure 13:
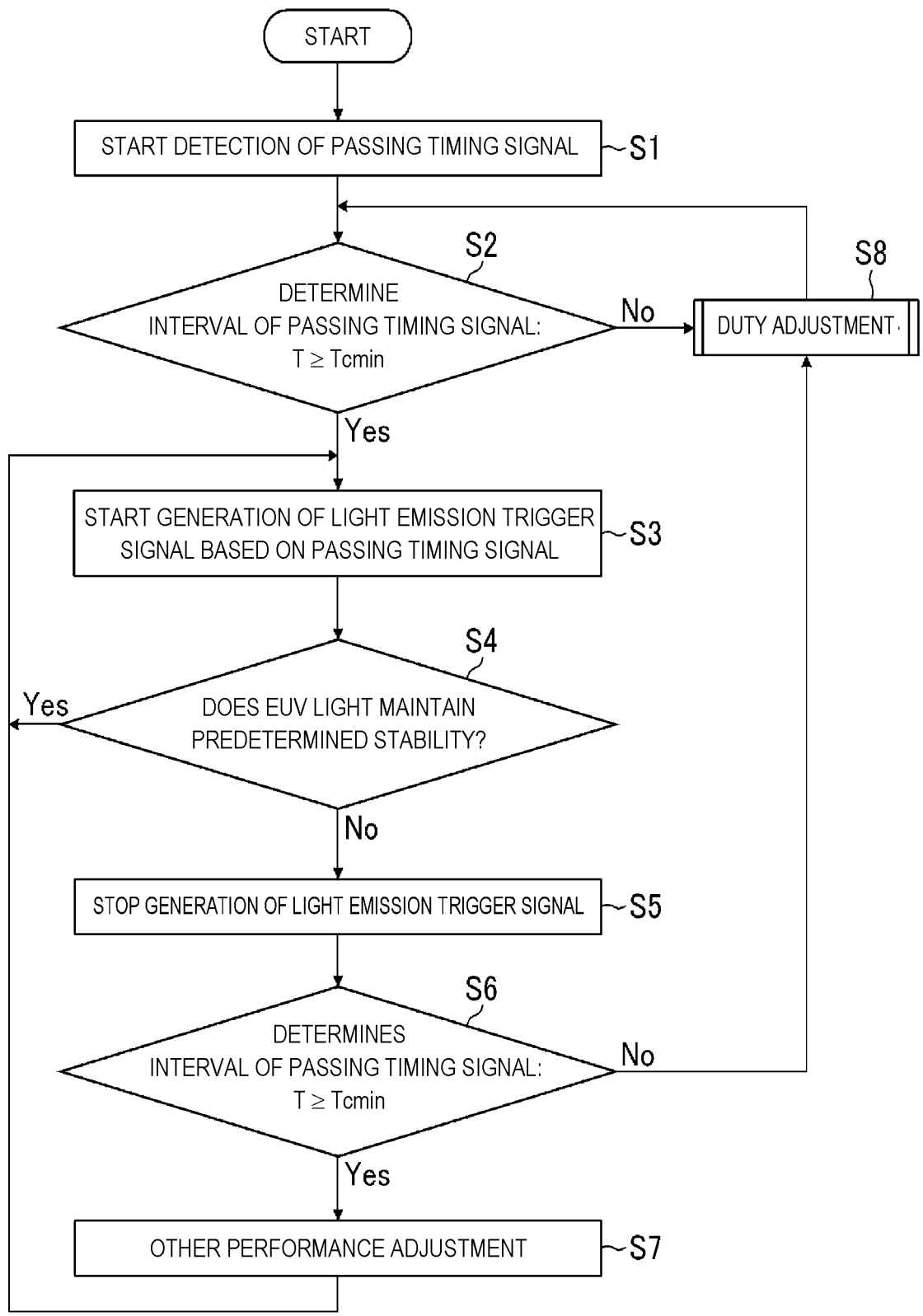
FIG. 13 is a flowchart of an exemplary operation of the control unit in FIG. 11.

FIG. 13 is a flowchart of an exemplary operation of the control unit 70. When an activation signal is input from the EUV light generation control unit 40 to the target supply device 78, the control unit 70 starts processing in the flowchart in FIG. 13.

At step S1, the control unit 70 starts detection of a passing timing signal.

At step S2, the control unit 70 determines whether or not the passing timing interval T is equal to or longer than predefined Tcmin. When determining that T is equal to or longer than Tcmin in the passing timing interval determination process at step S2, the control unit 70 proceeds to step S3. When determining that T is not equal to or longer than Tcmin, that is, determining that T is shorter than Tcmin at step S2, the control unit 70 proceeds to step S8.

At step S3, the control unit 70 starts generation of a light emission trigger signal based on the passing timing signal. When the generation of a light emission trigger signal is started, the delay circuit 72 may generate a light emission trigger signal behind the passing timing signal by a predetermined delay time td.

At step S4 after step S3, the control unit 70 determines whether or not EUV light generated by the EUV light generating apparatus 12 maintains predetermined stability. The control unit 70 performs the determination at step S4 based on a signal obtained from the EUV light generation control unit 40.

There may be a case that the EUV light generating apparatus 12 may temporarily stop generation of EUV light to adjust components thereof due to accidental reduced quality of the EUV light or the like. In this case, the generation of the light emission trigger signal may be stopped. For example, when a variance of EUV light energy exceeds ±2% for a moving average of a certain number of pulses within one burst, the control unit 70 may receive a light emission trigger stop signal.

In a burst operation, a burst period in which the EUV light is output at a constant repetition frequency for a certain duration and an intermission period in which the EUV light is not output for a predetermined duration are repeated. One burst period is referred to as one burst. During the burst period, the laser beam may be output from the laser apparatus 14. During the intermission period, the output of the laser beam from the laser apparatus 14 is stopped. Alternatively, during the intermission period, propagation of the laser beam to the plasma generating region 26 may be suppressed. A burst pattern can be defined by data including one or several of the EUV light energy, the repetition frequency, and the number of pulses in the burst period, a duration of the burst intermission period, and the number of bursts. The burst pattern may be instructed from the exposure apparatus 46.

At step S4 in FIG. 13, when determining that the EUV light generated by the EUV light generating apparatus maintains predetermined stability, the control unit 70 returns to step S3. When determining at step S4 that the EUV light does not maintain predetermined stability, for example, because the light emission trigger stop signal is input from the EUV light generation control unit 40 to the control unit 70, the control unit 70 proceeds to step S5.

At step S5, the control unit 70 stops the generation of the light emission trigger signal. When the generation of the light emission trigger signal is stopped, the output of the pulse laser beam from the laser apparatus 14 is stopped to stop the generation of the EUV light.

For restarting the generation of the EUV light, the control unit 70 may determine an interval of the passing timing signal at step S6, and perform duty adjustment at step S8 when T is shorter than Tcmin. At step S8, the control unit 70 adjusts a duty of a square wave electric signal for driving the piezoelectric element 202.

When determining that T is shorter than Tcmin at step S2 or step S6, the control unit 70 performs the duty adjustment at step S8.

When the passing timing interval T is equal to or longer than Tcmin at step S6, the control unit 70 proceeds to step S7.

At step S7, the control unit 70 may perform any performance adjustment other than the duty adjustment at step S8. After step S7, the control unit 70 can return to step S3 and restart generation of a light emission trigger signal. The flowchart in FIG. 13 can be finished at any timing by an interrupt from the EUV light generation control unit 40.

4.4.3 Exemplary Duty Adjustment

Figure 14:
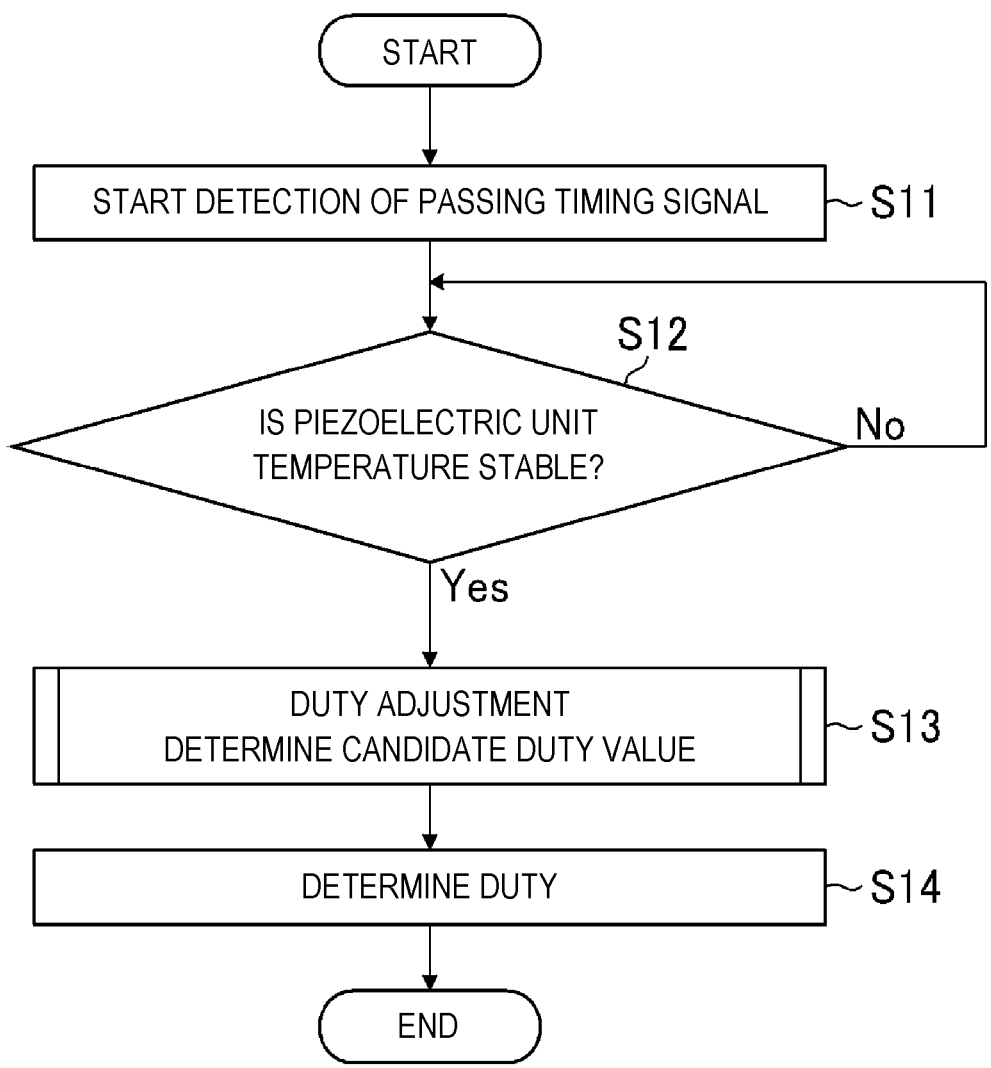
FIG. 14 is a flowchart of exemplary duty adjustment processing.

FIG. 14 is a flowchart of exemplary duty adjustment processing. At step S8 in FIG. 13, the control unit 70 performs the flowchart in FIG. 14. The control unit 70 may start the processing in the flowchart in FIG. 14 when an activation signal is input from the EUV light generation control unit 40 to the target supply device 78.

At step S11, the control unit 70 starts detection of a passing timing signal.

At step S12, the control unit 70 determines whether or not a piezoelectric unit temperature is stable based on piezoelectric unit temperature information obtained through the piezoelectric unit temperature monitor 102. When determining that the piezoelectric unit temperature is not stable, the control unit 70 loops through the processing at step S12 and waits until the piezoelectric unit temperature is stabilized.

When determining that the piezoelectric unit temperature is stable at step S12, the control unit 70 proceeds to step S13.

At step S13, the control unit 70 performs duty adjustment, and determines an optimum candidate duty value.

At step S14, the control unit 70 determines an optimum duty value as a drive condition for the piezoelectric element 202, and finishes the flowchart in FIG. 14.

Figure 15:
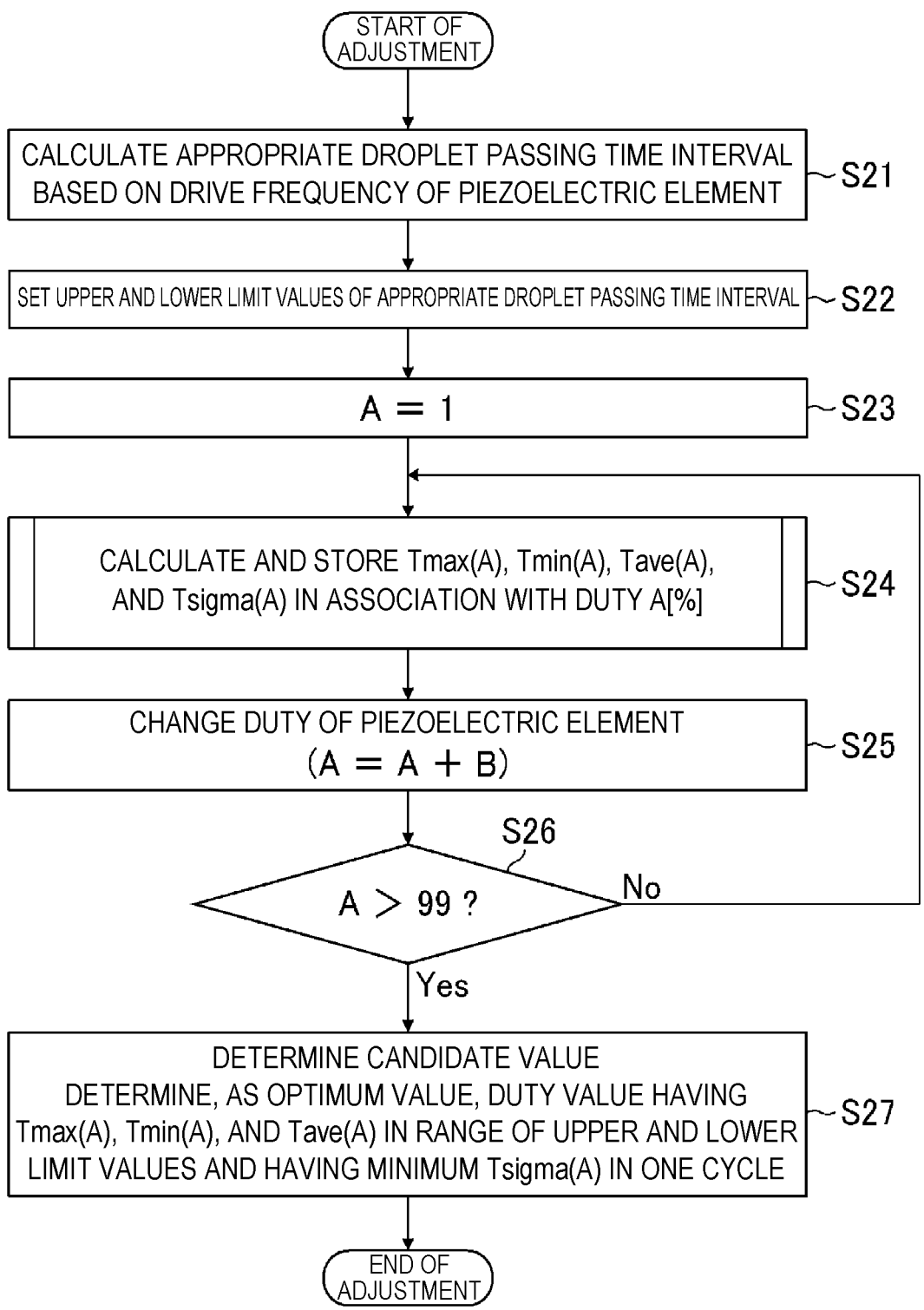
FIG. 15 is a flowchart of exemplary processing at step S13 in FIG. 14.

FIG. 15 is a flowchart of exemplary processing in step S13.

At step S21, the control unit 70 calculates an appropriate droplet passing time interval based on a drive frequency of the piezoelectric element 202. The appropriate droplet passing time interval is a droplet passing time interval that is ideal for design and predicted from the drive frequency of the piezoelectric element 202 and a droplet speed. The appropriate droplet passing time interval is an example of a predicted time interval.

At step S22, the control unit 70 sets upper and lower limit values of the appropriate droplet passing time interval. The upper and lower limit values are an upper limit value and a lower limit value. For example, the control unit 70 can set the upper and lower limit values to values of the droplet passing time interval "±15%", which is ideal for design and predicted from the drive frequency and the droplet speed. Thus, the control unit 70 may set an appropriate range of the droplet time interval to the appropriate droplet passing time interval ±15%. The processing at step S22 is an example of processing of setting an appropriate range. The appropriate range of the droplet passing timing interval can be an allowable range as the appropriate droplet passing time interval.

At step S23, the control unit 70 sets, to 1[%], a variable parameter A indicating a duty value of the duty adjusting unit 71B. An initial value of A is herein "1", but may be a value other than "1".

At step S24, the control unit 70 measures a droplet passing time interval T based on the set duty A %, calculates Tmax(A), Tmin(A), Tave(A), and Tsigma(A) in association with the duty A %, and stores the data.

The duty adjusting unit 71B drives the piezoelectric power source 96 based on the set duty A[%]. When the piezoelectric power source 96 is driven based on the set duty A[%], a droplet is generated, and a passing timing signal is output from the droplet detecting device 76.

When receiving the passing timing signal, the droplet interval measuring unit 71A measures passing timing intervals T(1), T(2), . . . , T(N) between droplets. The value N is an optional natural number that indicates the number of times of measurement of the passing timing interval and can be predefined. For example, N may be between 3 to 50 inclusive. As an example, N may be 5. The natural number k may be used to define a passing timing interval T(k) by a time interval t(k+1)−t(k) between passing timing t(k) of the k-th droplet and passing timing t(k+1) of the (k+1)-th droplet. Each passing timing interval T(1), T(2), . . . , T(N) measured by the droplet interval measuring unit 71A is an example of a measured passing time interval.

The control unit 70 may store the passing timing intervals T(1), T(2), . . . , T(N) measured by the droplet interval measuring unit 71A. The control unit 70 calculates, from each passing timing interval T(1), T(2), . . . , T(N), a maximum passing timing interval Tmax, a minimum passing timing interval Tmin, a passing timing interval average value Tave, and a passing timing interval variance Tsigma. Tsigma may be 3σ value of standard deviation. The 3σ value of standard deviation is a value of "3×σ" where σ represents the standard deviation.

The control unit 70 stores the calculated Tmax, Tmin, Tave, and Tsigma as Tmax(A), Tmin(A), Tave(A), and Tsigma(A) in association with the duty A[%]. Processing at step S24 will be described later with reference to FIG. 16.

At step S25 in FIG. 15, the control unit 70 adds B to A of the duty A % to update the value of the variable A. In other words, A+B is a new value A. The value B is a change amount of the variable A for each change (one step). A value range of A used in duty adjustment is actually 1 to 99%. The value B is, for example, 0.1% or 0.2%. The value B may be 0.01% or 1% in some cases. In this example, B is 0.1% and the duty value A ranges from 1% to 99%. For a total of 981 different duty values, data on Tmax(A), Tmin(A), Tave(A), and Tsigma(A) are obtained.

The control unit 70 sequentially changes the set duty A in the range of A=1 to 99[%] from the initial value of 1[%] by a step of B=0.1[%], and performs the processing at step 24 for each duty value.

At step S26, the control unit 70 determines whether or not the value A exceeds 99[%]. When the value A is equal to or smaller than 99[%], the control unit 70 returns to step S24. The processing at steps S24 to S26 is repeated until the duty A exceeds 99[%].

When determining that the duty A exceeds 99[%] at step S26, the control unit 70 proceeds to step S27.

At step S27, the control unit 70 determines an optimum candidate duty value based on a calculation result of the passing timing interval for each duty obtained in the range of A=1 to 99[%]. For example, the control unit 70 determines, as optimum candidate duty values, duty values having Tmax(A), Tmin(A), and Tave(A) in the appropriate range defined by the upper and lower limit values of the appropriate droplet passing time interval, and determines, as an optimum value, a duty value having minimum Tsigma(A) in one cycle among the candidate duty values. "One cycle" is herein a period in which a predetermined number of the passing timing intervals T(1), T(2), . . . , T(N) are measured.

When the optimum duty value is specified at step 27, the control unit 70 may finish the adjustment processing in FIG. 15 and return to the flowchart in FIG. 14.

Figure 16:
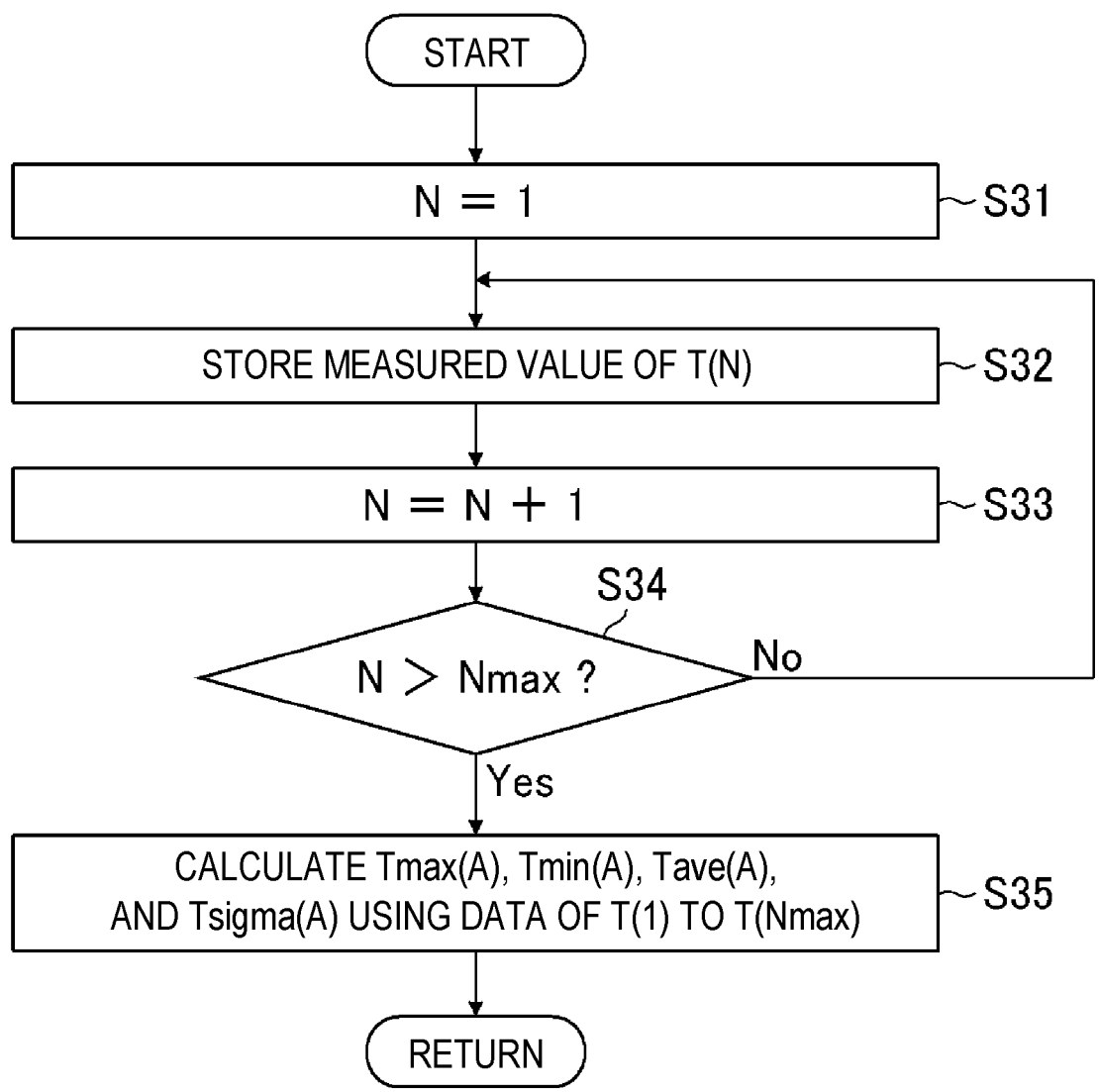
FIG. 16 is a flowchart of exemplary processing at step S24 in FIG. 15.

FIG. 16 is a flowchart of the processing at step S24 in FIG. 15. At step S31 in FIG. 16, the control unit 70 sets a parameter N to an initial value of 1.

At step S32, the droplet interval measuring unit 71A stores a measured value of the passing timing interval T(N).

At step S33, the control unit 70 increments the value of N by "+1", and newly sets the value of the parameter N to "N+1".

At step S34, the control unit 70 determines whether the value of N exceeds a predefined value Nmax. The value Nmax may be set to an optional integer defining the maximum number of times of measurement of the passing timing interval. For example, Nmax may be set to an appropriate value in the range of 3 to 50.

When determining that N is equal to or smaller than Nmax at step S54, the control unit 70 returns to step S32.

When determining that N is larger than Nmax at step S34, the control unit 70 proceeds to step S35.

At step S35, the control unit 70 calculates Tmax(A), Tmin(A), Tave(A), and Tsigma(A) using the data of T(1) to T(Nmax). The control unit 70 stores the calculated Tmax (A), Tmin(A), Tave(A), and Tsigma(A). Tmax (A) corresponds to a maximum value of the droplet detection interval. Tmin(A) corresponds to a minimum value of the droplet detection interval. Tave(A) corresponds to an average value of the droplet detection interval. Tsigma(A) corresponds to a variance of the droplet detection interval.

After step S35, the control unit 70 returns to the flowchart in FIG. 15.

5. Problem

As described with reference to FIG. 3, the outlet temperature of the chiller unit 110 is controlled to be constant based on the output from the coolant temperature sensor 116. On the other hand, a vibration propagating state of the vibration propagating path extending from the piezoelectric element 202 to the nozzle hole 80a is affected by a mechanical property of a vibration propagating path member constituting the vibration propagating path for each target supply device 78, and also a temperature of the vibration propagating path during vibration. The vibration propagating path includes the piezoelectric unit 88 and a body of the nozzle 80.

Thus, if the vibration propagating path is maintained at a certain constant temperature, the number of candidate duty values usable in an EUV light emission process, which is determined in a duty adjustment process, is unique for each vibration propagating path.

Thus, at a certain constant temperature of the vibration propagating path, some vibration propagating paths may have an extremely small number of or "zero" candidate duty values that are usable.

In such a case, robustness against various kinds of disturbance during generation of droplets may extremely decrease, which causes unstable droplet connection and thus causes unstable EUV light emission.

6. Embodiment 1

6.1 Configuration

Figure 17:
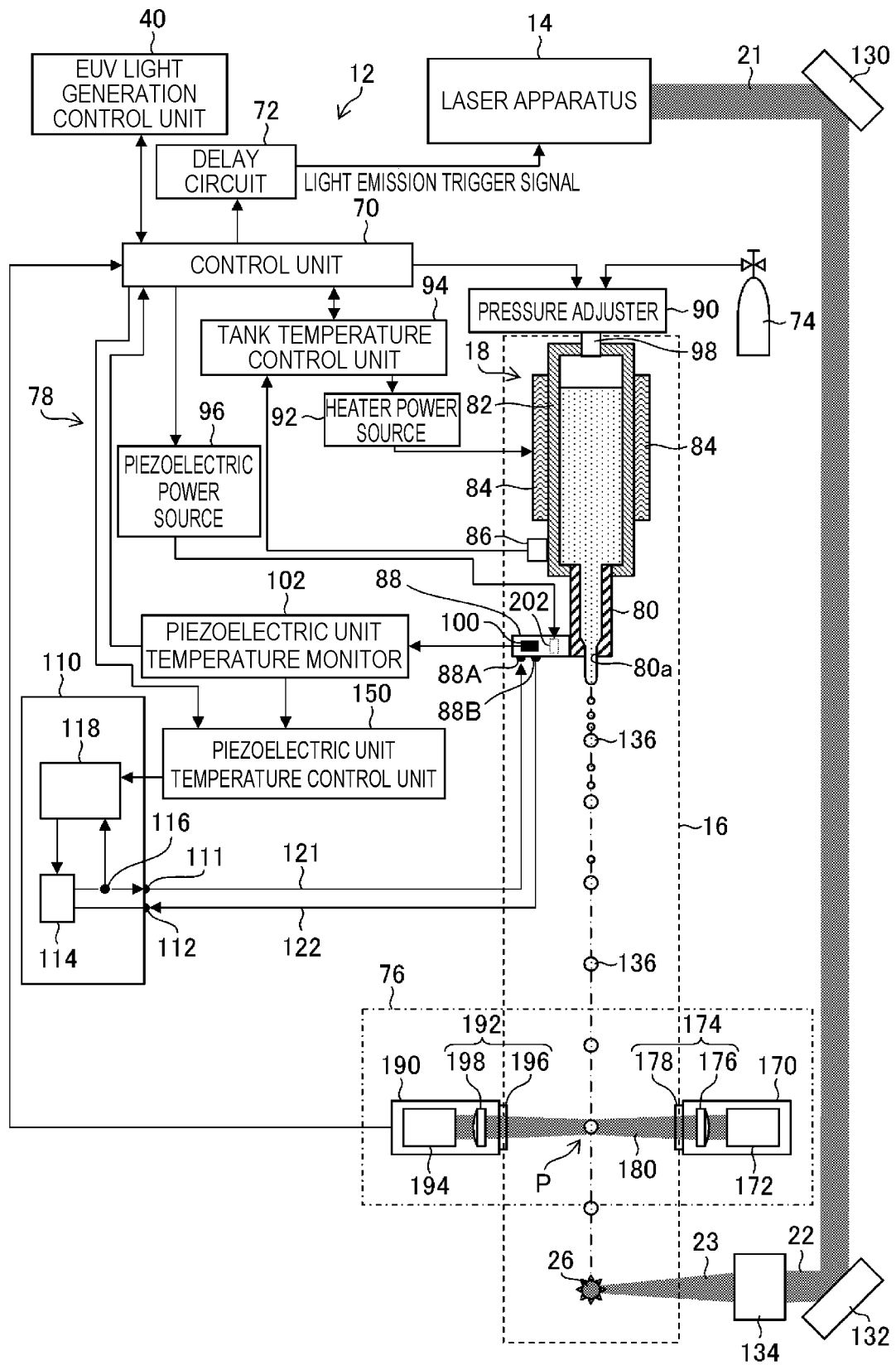
FIG. 17 schematically shows a configuration of an EUV light generating apparatus including a target supply device according to Embodiment 1.

FIG. 17 schematically shows a configuration of an EUV light generating apparatus including a target supply device according to Embodiment 1. Differences from the configuration in FIG. 3 will be described.

The target supply device 78 according to Embodiment 1 in FIG. 17 performs duty adjustment by changing a temperature of a vibration propagating path, which can be an adjustment parameter of droplet connection, and performs droplet connection at an optimum vibration propagating path temperature in each vibration propagating path.

As shown in FIG. 17, the target supply device 78 according to Embodiment 1 includes a piezoelectric unit temperature control unit 150 configured to control a chiller outlet temperature so that a piezoelectric unit temperature is constant based on piezoelectric unit temperature information from a piezoelectric unit temperature monitor 102. "Being constant" herein includes substantially being constant with variations or variances within a predetermined allowable temperature range including a control target temperature.

The piezoelectric unit temperature control unit 150 is connected to the piezoelectric unit temperature monitor 102. The piezoelectric unit temperature control unit 150 is connected to a control unit 70 and a coolant temperature control unit 118 of a chiller unit 110.

The control unit 70 can output, to the piezoelectric unit temperature control unit 150, a piezoelectric unit temperature instruction signal for changing a piezoelectric unit temperature to a specified temperature.

The piezoelectric unit temperature control unit 150 can output, to the chiller unit 110, a coolant temperature instruction signal for changing a coolant temperature, in order to change the piezoelectric unit temperature to a specified temperature. The piezoelectric unit temperature control unit 150 performs feedback control of the outlet temperature of the chiller unit 110 through the coolant temperature control unit 118 of the chiller unit 110 so that the piezoelectric unit temperature is constant, based on the piezoelectric unit temperature information from the piezoelectric unit temperature monitor 102. The piezoelectric unit temperature control unit 150 transmits a coolant temperature instruction signal to the coolant temperature control unit 118 of the chiller unit 110 in accordance with the piezoelectric unit temperature information.

The piezoelectric unit temperature control unit 150 may obtain the piezoelectric unit temperature information from the piezoelectric unit temperature monitor 102, or may directly obtain the piezoelectric unit temperature information from the piezoelectric unit temperature sensor 100.

The piezoelectric unit temperature sensor 100 is typically a thermocouple. The piezoelectric unit temperature sensor 100 may be, for example, a K-TYPE thermocouple. The piezoelectric unit temperature sensor 100 is desirably arranged with a temperature detecting unit being as close as possible to the vibration propagating path without inhibiting vibration propagation.

The control unit 70 controls a duty value of a voltage waveform of a square wave applied to a piezoelectric element 202. The control unit 70 can determine a duty value having an optimum droplet passing time interval.

6.2 Operation

In the configuration in FIG. 17, the piezoelectric unit temperature sensor 100 measures a piezoelectric unit temperature, and the piezoelectric unit temperature monitor 102 monitors the piezoelectric unit temperature. The control unit 70 and the piezoelectric unit temperature control unit 150 each obtain piezoelectric unit temperature information from the piezoelectric unit temperature monitor 102.

The control unit 70 transmits a piezoelectric unit temperature instruction signal to the piezoelectric unit temperature control unit 150. The piezoelectric unit temperature instruction signal contains information on a specified temperature of the piezoelectric unit temperature. The specified temperature of the piezoelectric unit temperature specified by the control unit 70 is referred to as "specified piezoelectric unit temperature".

The piezoelectric unit temperature control unit 150 transmits, to the coolant temperature control unit 118 of the chiller unit 110, a coolant temperature instruction signal for maintaining the piezoelectric unit temperature at the specified piezoelectric unit temperature specified by the control unit 70. Thus, a coolant temperature at the coolant outlet 111 of the chiller unit 110 is adjusted.

The control unit 70 successively changes a duty value of a voltage waveform of a square wave applied to the piezoelectric element 202, and measures a droplet passing time interval for each duty value. For example, the control unit successively changes the duty value from 1% to 99% by a step (change amount) of 0.1%, and measures a droplet passing time interval for each duty value.

Further, the control unit 70 changes the specified piezoelectric unit temperature. For example, the control unit 70 can change a control target temperature of a piezoelectric unit temperature by a step (change amount) of +1.0° C. The control unit 70 can output the piezoelectric unit temperature instruction signal to the piezoelectric unit temperature control unit 150.

Then, the control unit 70 again successively changes the duty value of the voltage waveform of the square wave applied to the piezoelectric element 202, and measures a droplet passing time interval for each duty value.

As such, the control unit 70 performs, a predetermined number of times, the processes of change of the specified piezoelectric unit temperature and duty adjustment at each temperature, and then determines, as "optimum piezoelectric unit temperature", a specified piezoelectric unit temperature with the largest number of duty values having an optimum droplet passing time interval.

The control unit 70 sets the optimum piezoelectric unit temperature to the specified temperature of the piezoelectric unit temperature.

Then, the control unit 70 again performs duty adjustment with the piezoelectric unit temperature being adjusted to the optimum piezoelectric unit temperature. In the duty adjustment process, the duty value with the optimum droplet passing time interval is determined and set as an operation duty value used in a subsequent EUV light emission process. The optimum piezoelectric unit temperature corresponds to an operation specified temperature used in the EUV light emission process. Specifically, the optimum piezoelectric unit temperature is a specified temperature of a vibration propagating path member when a droplet is irradiated with a laser beam.

Figure 18:
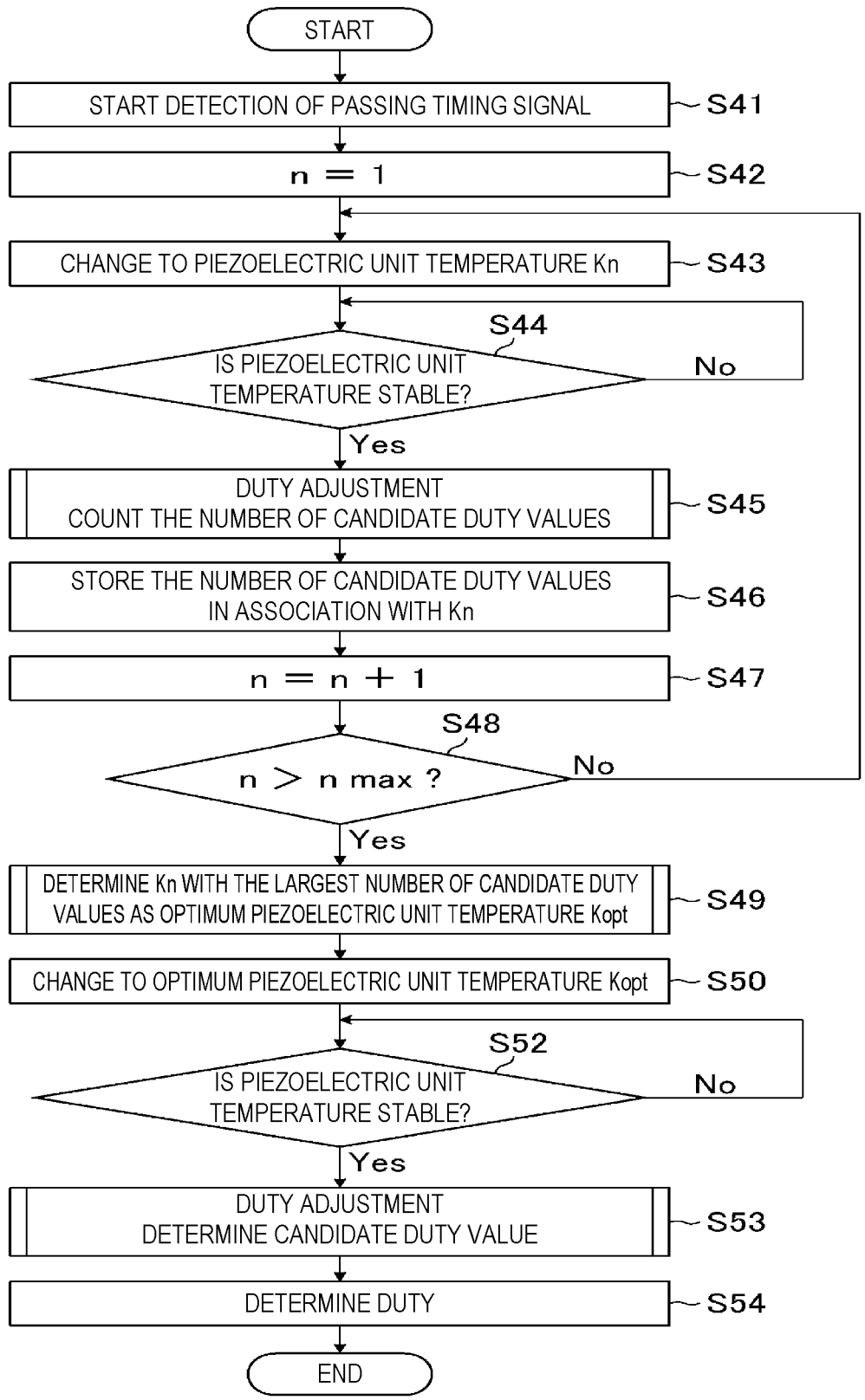
FIG. 18 is a flowchart of exemplary control of the target supply device according to Embodiment 1.

6.3 Exemplary Control Including Processes of Change of Piezoelectric Unit Temperature and Duty Adjustment FIG. 18 is a flowchart of exemplary control of the target supply device according to Embodiment 1.

At step S41, the control unit 70 starts detection of a passing timing signal of a droplet.

At step S42, the control unit 70 sets a value of an index n indicating the number of times of change of a piezoelectric unit temperature to an initial value of "1".

At step S43, the control unit 70 changes a specified temperature of a piezoelectric unit temperature to a piezoelectric unit temperature Kn. The piezoelectric unit temperature Kn is expressed by an equation below.

$$Kn = K_1 + \Delta K \times (n-1)$$

where $K_1$ may be, for example, "50° C." and $\Delta K$ may be, for example "+1° C.". The piezoelectric unit temperature Kn is a specified piezoelectric unit temperature.

At step S44, the control unit 70 determines whether or not the piezoelectric unit temperature is stable. The control unit 70 performs determination processing at step S44 based on piezoelectric unit temperature information obtained from the piezoelectric unit temperature monitor 102. When determining that the piezoelectric unit temperature is stable, the control unit 70 proceeds to step S45.

At step S45, the control unit 70 performs duty adjustment, and counts the number of candidate duty values. The processing at step S45 will be described later with reference to FIG. 19.

At step S46, the control unit 70 stores the number of candidate duty values in association with Kn.

At step S47, the control unit 70 increments the value of n by "+1", and newly sets the value of n to "n+1".

At step S48, the control unit 70 compares the present value of n with nmax that is a predefined upper limit value of n, and determines whether or not n is larger than nmax. The value nmax may be, for example, "5". The value nmax is not limited to this, but may be any value.

When determining no at step S48, the control unit 70 returns to step S43, and repeats the processing at step S43 to step S48.

When determining yes at step S48, the control unit 70 proceeds to step S49.

At step S49, the control unit 70 determines Kn with the largest number of candidate duty values as an optimum piezoelectric unit temperature Kopt.

At step S50, the control unit 70 changes the specified temperature of the piezoelectric unit temperature to the optimum piezoelectric unit temperature Kopt. The control unit 70 transmits a piezoelectric unit temperature instruction signal to the piezoelectric unit temperature control unit 150. The piezoelectric unit temperature control unit 150 controls a coolant temperature in accordance with the specified temperature specified by the piezoelectric unit temperature instruction signal.

The processing at step S52 to step S54 is the same as that at step S12 to step S14 in FIG. 11.

Figure 19:
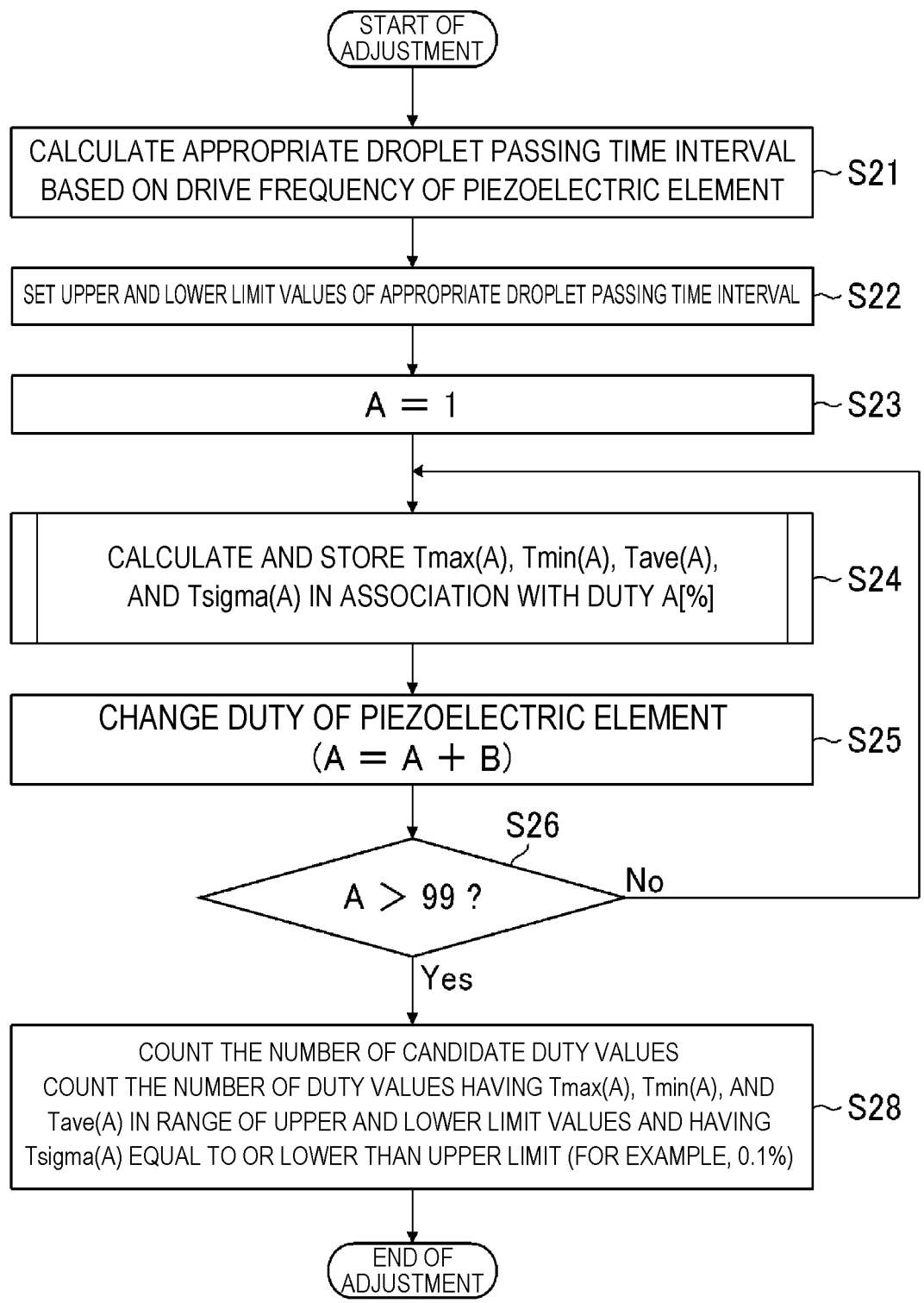
FIG. 19 is a flowchart of exemplary processing at step S45 in FIG. 18.

FIG. 19 is a flowchart of exemplary processing at step S45 in FIG. 18. In FIG. 19, the same steps as in the flowchart in FIG. 15 are denoted by the same step numbers, and descriptions thereof will be omitted. Differences from FIG. 15 will be described.

The flowchart in FIG. 19 includes step S28 instead of step S27 in FIG. 15.

At step S28, the control unit 70 counts the number of candidate duty values. The control unit 70 counts, based on data stored at step S24, the number of duty values having Tmax(A), Tmin(A), and Tave(A) each within an appropriate range defined by upper and lower limit values and Tsigma (A) equal to or lower than a predefined upper limit (for example, 0.1%). The number of duty values obtained in the processing at step S28 is "the number of candidate duty values". The condition that Tmax(A), Tmin(A), and Tave(A) are each within the appropriate range defined by the upper and lower limit values and that Tsigma(A) is equal to or lower than the predefined upper limit (for example, 0.1%) is an example of a determination reference condition.

After step S28, the control unit 70 returns to the flowchart in FIG. 18.

In Embodiment 1, the processing of changing the specified piezoelectric unit temperature and searching for an appropriate duty value while changing the duty value at each specified temperature corresponds to processing of changing a combination of the specified temperature and the duty value to specify an optimum combination of the temperature and the duty value.

The processing at steps S43 to S45 in FIG. 18 is an example of processing of changing a combination of the specified temperature and the duty value, obtaining data on the droplet detection interval of the droplet generated in association with each combination of the specified temperature and the duty value, and storing the data on the droplet detection interval in association with the combination.

6.4 Effect

According to Embodiment 1, the duty adjustment processing is performed at the plurality of specified piezoelectric unit temperatures. Thus, duty adjustment can be performed at a piezoelectric unit temperature more appropriate for a piezoelectric unit 88 as compared to when duty adjustment is performed only at a single specified piezoelectric unit temperature. According to Embodiment 1, the number of duty values at which droplet connection is facilitated increase as compared to when duty adjustment is performed only at a single temperature.

A subsequent EUV light emission process is performed at such a piezoelectric unit temperature, which further stabilizes droplet connection and thus stabilizes EUV light emission.

7. Embodiment 2

7.1 Configuration

Figure 20:
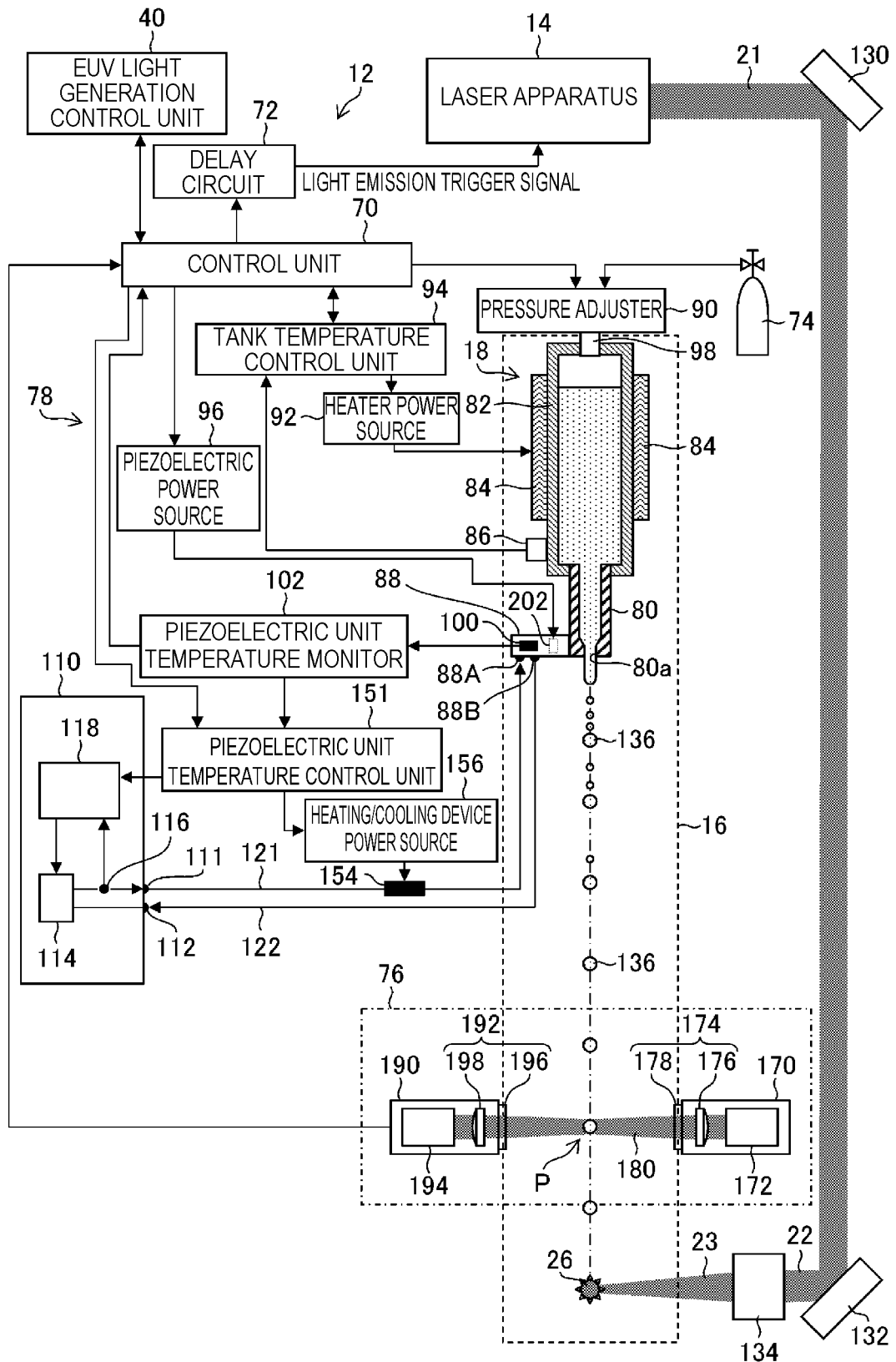
FIG. 20 schematically shows a configuration of an EUV light generating apparatus including a target supply device according to Embodiment 2.

FIG. 20 schematically shows a configuration of an EUV light generating apparatus including a target supply device according to Embodiment 2. Differences from Embodiment 1 described with reference to FIG. 17 will be described. Embodiment 2 is different from Embodiment 1 in that a piezoelectric unit temperature is stabilized using a heating/cooling device 154 that is a temperature adjusting mechanism different from the coolant heating and cooling unit 114 of the chiller unit 110.

The target supply device 78 in FIG. 20 includes a heating/cooling device 154, and a heating/cooling device power source 156 for driving the heating/cooling device 154. The heating/cooling device 154 includes at least one of the heating device and the cooling device. The heating device is typically a heater. The cooling device is typically a Peltier element. The heating/cooling device 154 may include one or both of the heating device and the cooling device.

The heating/cooling device 154 is arranged on a coolant supply channel 121 extending from the coolant outlet 111 of the chiller unit 110 to a coolant inlet 88A of the piezoelectric unit 88. The heating/cooling device 154 may be arranged outside a chamber 16. FIG. 20 shows an example of the heating/cooling device 154 arranged outside the chamber 16. In Embodiment 2, the heating/cooling device 154 is arranged outside the chamber 16 and desirably as close as possible to the piezoelectric unit 88 on the coolant supply channel 121.

The heating/cooling device 154 is connected to the heating/cooling device power source 156. The heating/cooling device power source 156 supplies drive power to the heating/cooling device 154.

The target supply device 78 in FIG. 20 includes a piezoelectric unit temperature control unit 151 connected to the heating/cooling device power source 156. The piezoelectric unit temperature control unit 151 is connected to the control unit 70 and the piezoelectric unit temperature monitor 102.

The piezoelectric unit temperature control unit 151 controls the heating/cooling device power source 156 to control a piezoelectric unit temperature.

The control unit 70 can output, to the piezoelectric unit temperature control unit 151, an instruction signal for changing the piezoelectric unit temperature to a specified temperature.

The piezoelectric unit temperature control unit 151 can transmit, to the heating/cooling device power source 156, a heating/cooling device temperature instruction signal for changing a heating/cooling device temperature to change the piezoelectric unit temperature to the specified temperature.

7.2 Operation

In FIG. 20, the piezoelectric unit temperature control unit 151 adjusts the heating/cooling device temperature to maintain the piezoelectric unit temperature at the specified piezoelectric unit temperature instructed from the control unit 70.

"Maintaining the piezoelectric unit temperature at the specified piezoelectric unit temperature" includes maintaining the piezoelectric unit temperature substantially constant with variations or variances within a predetermined allowable temperature range including the specified piezoelectric unit temperature. For example, the allowable temperature range may be the specified piezoelectric unit temperature $\pm 0.1°$ C.

The operation of changing the specified piezoelectric unit temperature, performing duty adjustment at each specified temperature, and determining an optimum piezoelectric unit temperature and an optimum duty value is the same as in Embodiment 1.

7.3 Effect

In the configuration in Embodiment 2, the piezoelectric unit temperature is adjusted using the heating/cooling device 154 arranged closer to the piezoelectric unit 88, and thus the temperature of the piezoelectric unit can be changed with higher accuracy than in the configuration in Embodiment 1.

Thus, duty adjustment at the changed temperature can be performed with higher accuracy, and the number of duty values at which droplet connection is facilitated increases. A subsequent EUV light emission process is performed at such a piezoelectric unit temperature. This further stabilizes droplet connection and thus stabilizes EUV light emission.

8. Embodiment 3

8.1 Configuration

Figure 21:
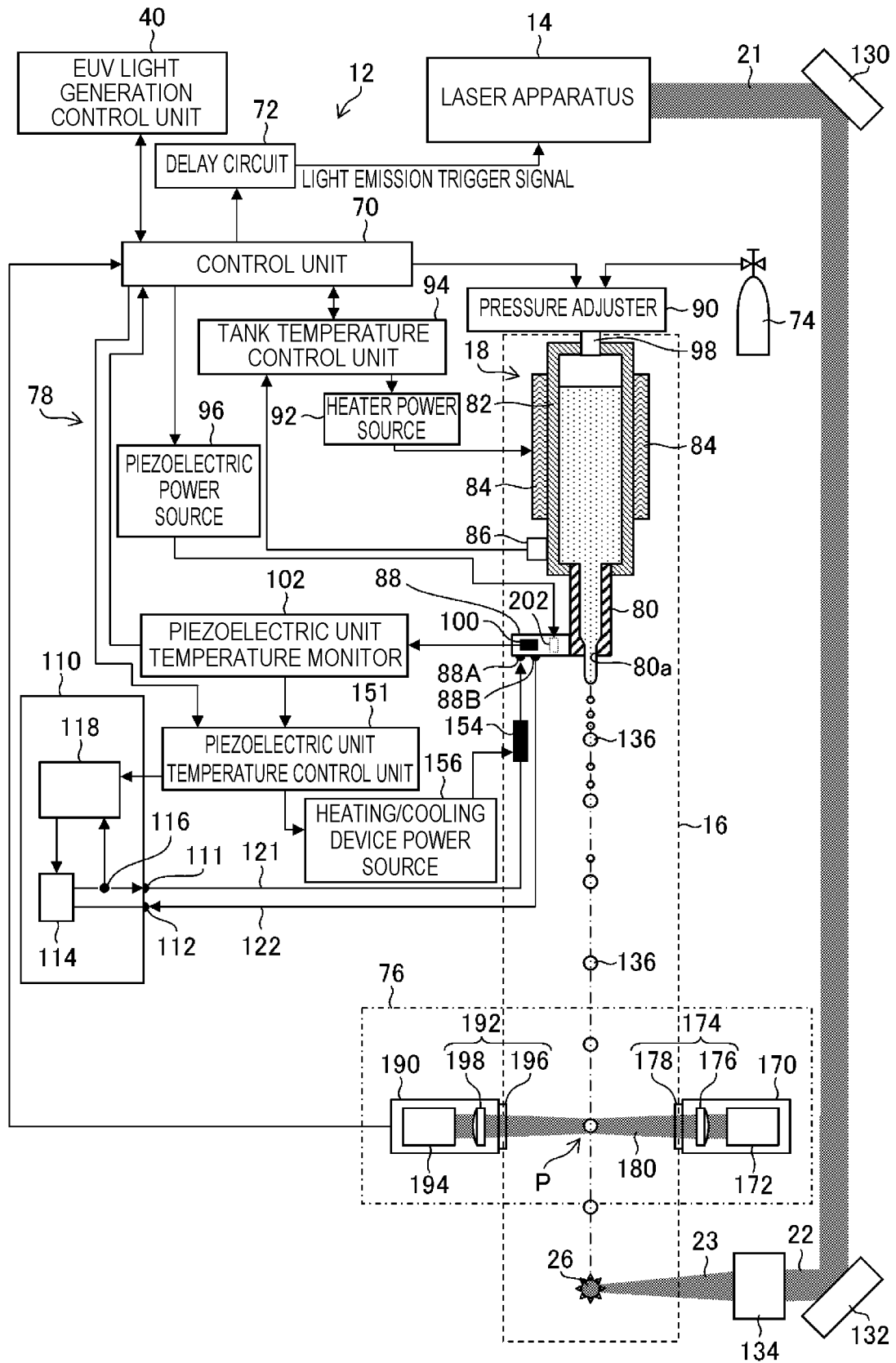
FIG. 21 schematically shows a configuration of an EUV light generating apparatus including a target supply device according to Embodiment 3.

FIG. 21 schematically shows a configuration of an EUV light generating apparatus including a target supply device according to Embodiment 3. Differences from Embodiment 2 described with reference to FIG. 20 will be described. The target supply device 78 in FIG. 21 is different from that of Embodiment 2 in that the heating/cooling device 154 is arranged inside the chamber 16. Other configurations are the same as those in Embodiment 2.

8.2 Operation

The operation of the target supply device 78 in FIG. 21 is the same as that in Embodiment 2 described with reference to FIG. 20.

8.3 Effect

According to Embodiment 3, the same effect as that of Embodiment 2 can be obtained. In the configuration in Embodiment 3, the piezoelectric unit temperature is adjusted using the heating/cooling device 154 arranged closer to the piezoelectric unit 88, and thus the temperature of the piezoelectric unit can be changed with higher accuracy than in the configuration in Embodiment 2.

In the configuration in Embodiment 3, duty adjustment at the changed temperature can be performed with higher accuracy, and the duty value and the piezoelectric unit temperature at which droplet connection is facilitated can be set to more appropriate ones than in the configuration in Embodiment 2. This further stabilizes droplet connection and thus stabilizes EUV light emission.

9. Embodiment 4

9.1 Configuration

Figure 22:
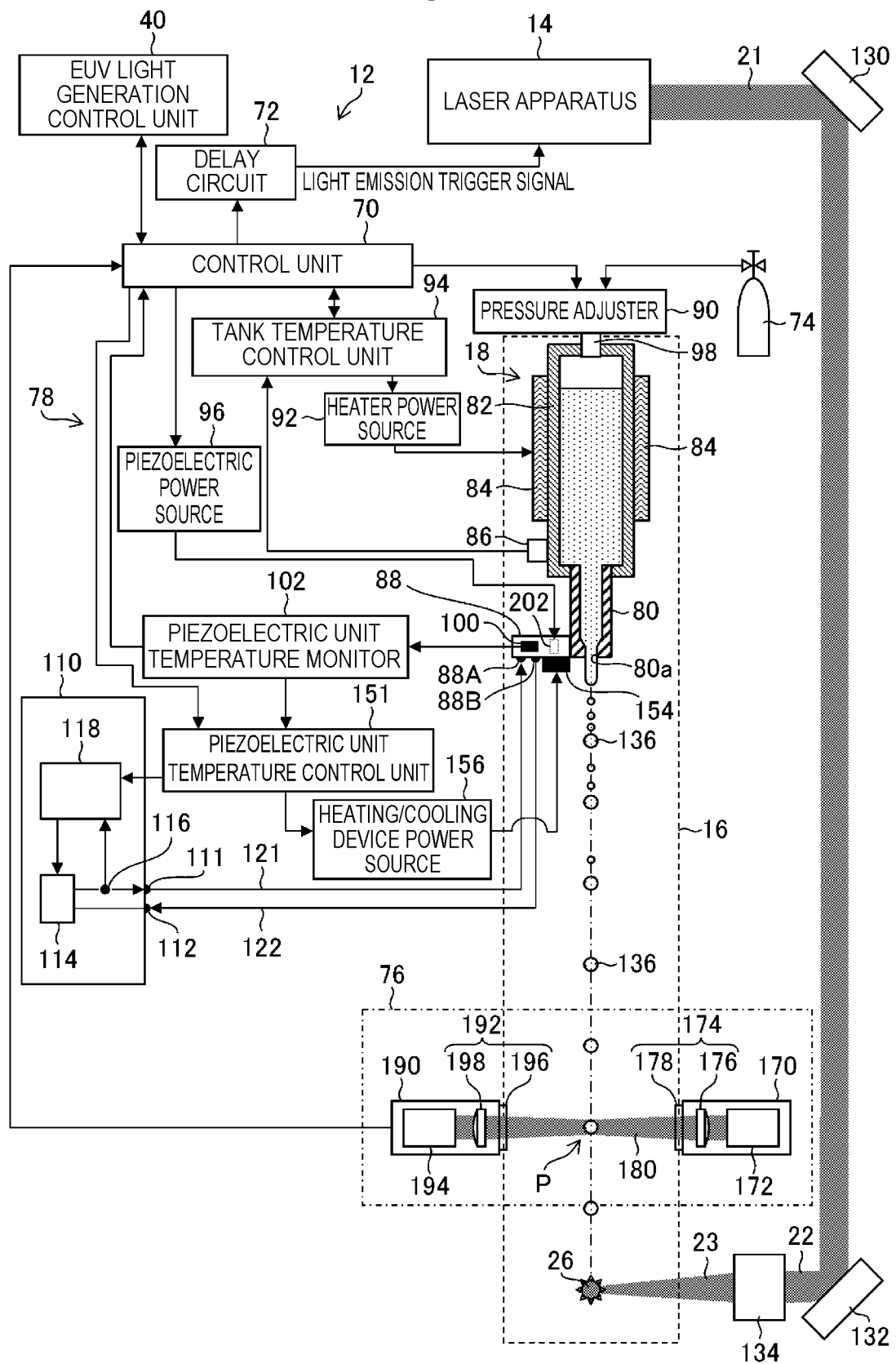
FIG. 22 schematically shows a configuration of an EUV light generating apparatus including a target supply device according to Embodiment 4.

FIG. 22 schematically shows a configuration of an EUV light generating apparatus including a target supply device according to Embodiment 4. Differences from Embodiment 2 described with reference to FIG. 20 will be described. The target supply device 78 in FIG. 22 is different from that of Embodiment 2 in that the heating/cooling device 154 is arranged on a surface of the piezoelectric unit 88 or inside the piezoelectric unit 88. Other configurations are the same as those in Embodiment 2.

9.2 Operation

In the target supply device 78 in FIG. 22, the heating/cooling device 154 arranged on/in the piezoelectric unit 88 directly heats or cools the piezoelectric unit 88. Other operations are the same as those in Embodiment 2.

9.3 Effect

According to Embodiment 4, the same effect as that of Embodiment 2 can be obtained. In Embodiment 4, the piezoelectric unit temperature is adjusted using the heating/cooling device 154 directly arranged on/in the piezoelectric unit 88 including a vibration propagating path. Thus, the temperature of the piezoelectric unit 88 can be changed with much higher accuracy than in the configurations in Embodiments 2 and 3. Thus, in the configuration in Embodiment 4, duty adjustment at the changed temperature can be performed with higher accuracy, and the duty value and the piezoelectric unit temperature at which droplet connection is facilitated can be set to more appropriate ones. This further stabilizes droplet connection and thus stabilizes EUV light emission.

10. Embodiment 5

10.1 Configuration

Figure 23:
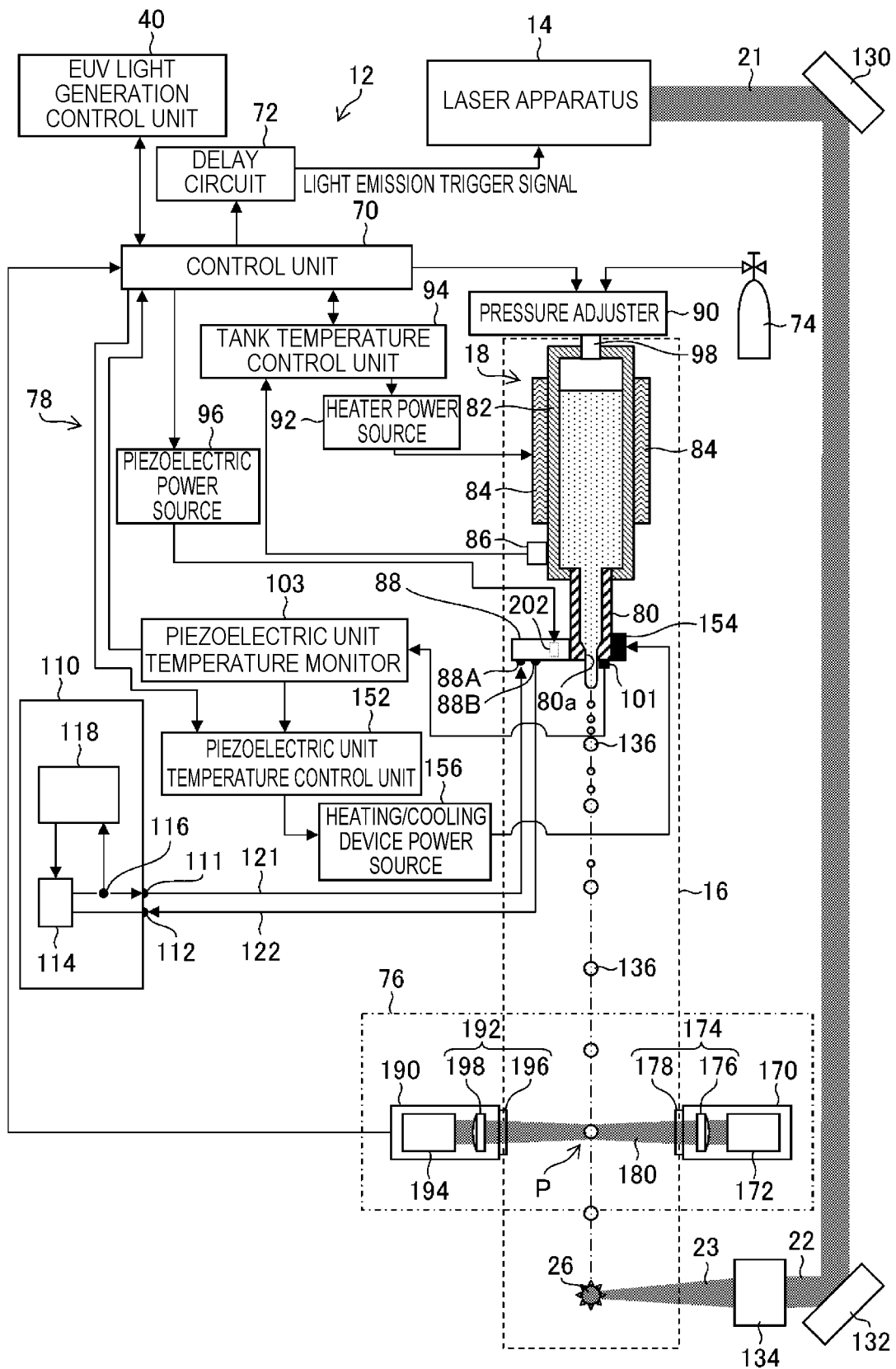
FIG. 23 schematically shows a configuration of an EUV light generating apparatus including a target supply device according to Embodiment 5.

FIG. 23 schematically shows a configuration of an EUV light generating apparatus including a target supply device according to Embodiment 5. Differences from Embodiment 2 in FIG. 20 will be described. In the target supply device 78 in FIG. 23, the heating/cooling device 154 is arranged on a body surface of the nozzle 80. The target supply device 78 includes a nozzle temperature sensor 101, a nozzle temperature monitor 103, and a nozzle temperature control unit 152 instead of the piezoelectric unit temperature sensor 100, the piezoelectric unit temperature monitor 102, and the piezoelectric unit temperature control unit 151 in FIG. 20.

The nozzle temperature sensor 101 measures the temperature of the nozzle 80. The nozzle temperature sensor 101 is arranged in contact with a member constituting the nozzle 80. The nozzle temperature sensor 101 is typically a thermocouple. The nozzle temperature sensor 101 may be, for example, a K-TYPE thermocouple. The temperature of the nozzle 80 is referred to as "nozzle temperature". The nozzle 80 constitutes part of the vibration propagating path, and the nozzle temperature is information directly or indirectly indicating the temperature of the vibration propagating path. In Embodiment 5, the nozzle temperature is used as the information indicating the temperature of the vibration propagating path. The nozzle temperature sensor 101 is connected to the nozzle temperature monitor 103.

The nozzle temperature monitor 103 monitors the nozzle temperature information obtained from the nozzle temperature sensor 101. The nozzle temperature monitor 103 includes a display device or an indicator configured to output the nozzle temperature information in a visualized manner.

The nozzle temperature monitor 103 is connected to the control unit 70 and the nozzle temperature control unit 152. The nozzle temperature control unit 152 is connected to the control unit 70 and the heating/cooling device power source 156.

The control unit 70 can output, to the nozzle temperature control unit 152, a nozzle temperature instruction signal for changing the nozzle temperature to a specified temperature. The nozzle temperature instruction signal contains information on the specified temperature of the nozzle temperature. The specified temperature of the nozzle temperature specified by the control unit 70 is referred to as "specified nozzle temperature".

The nozzle temperature control unit 152 can transmit, to the heating/cooling device power source 156, a heating/cooling device temperature instruction signal for changing a heating/cooling device temperature to change the nozzle temperature to the specified temperature.

10.2 Operation

In the target supply device 78 in FIG. 23, the temperature of the nozzle 80 is monitored, and the heating/cooling device 154 fixed to a side surface of the nozzle 80 directly heats or cools the body of the nozzle 80. The nozzle 80 is a vibration propagating path member that constitutes part of the vibration propagating path.

The nozzle temperature control unit 152 adjusts the heating/cooling device temperature to maintain the nozzle temperature at the specified nozzle temperature instructed form the control unit 70.

"Maintaining the nozzle temperature at the specified nozzle temperature" includes maintaining the nozzle temperature substantially constant with variations or variances within a predetermined allowable temperature range including the specified nozzle temperature. For example, the allowable temperature range may be the specified nozzle temperature ±0.1° C.

The operation of the control unit 70 of changing the specified nozzle temperature, performing duty adjustment at each specified temperature, and determining an optimum nozzle temperature and an optimum duty value is the same as that in Embodiment 1.

Figure 24:
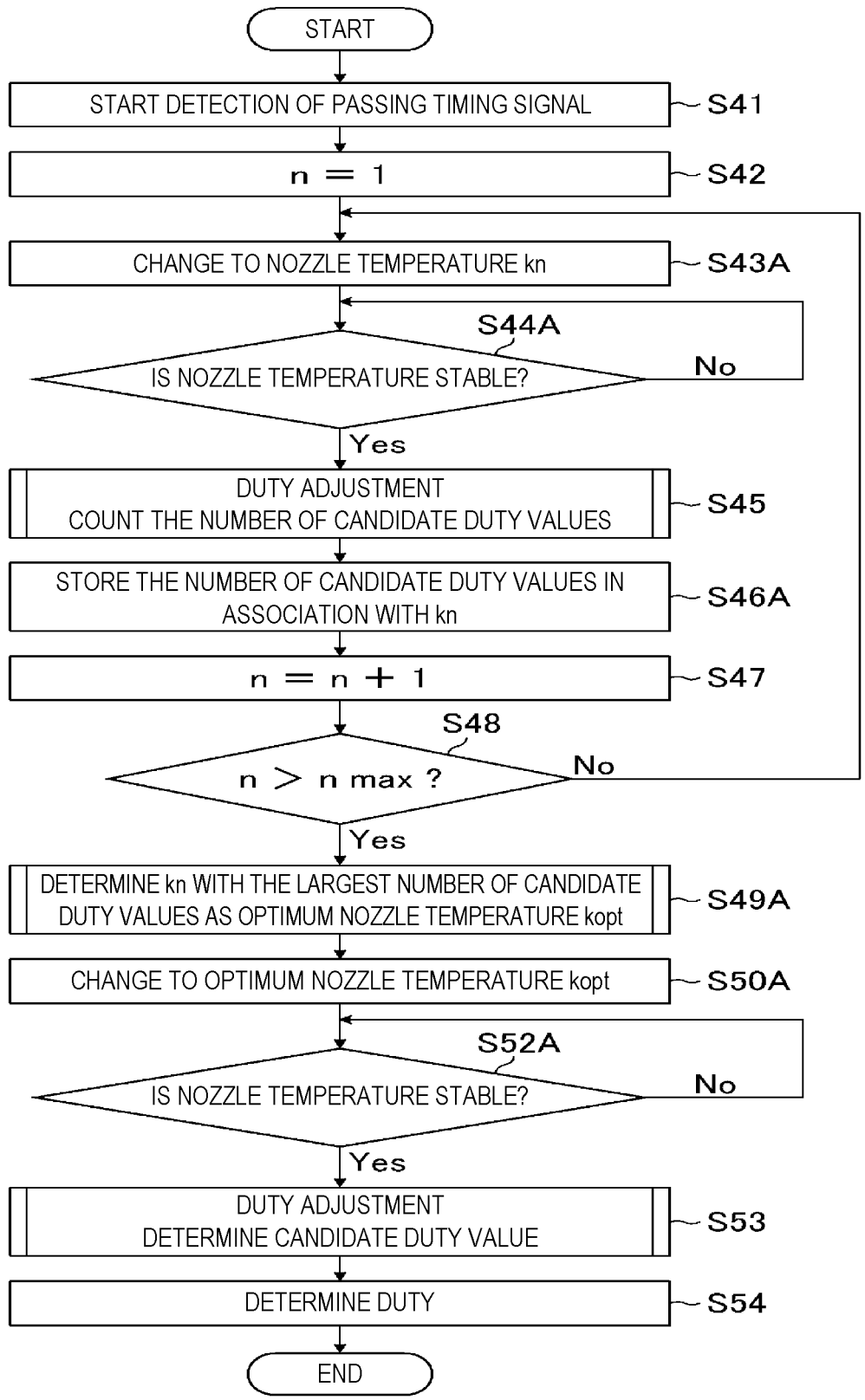
FIG. 24 is a flowchart of exemplary control of the target supply device according to Embodiment 5.

10.3 Exemplary Control Including Processes of Change of Nozzle Temperature and Duty Adjustment FIG. 24 is a flowchart of exemplary control of the target supply device in Embodiment 5. In the flowchart in FIG. 24, the same steps as described with reference to FIG. 8 are denoted by the same step numbers, and descriptions thereof will be omitted.

The flowchart in FIG. 24 includes steps S43A, S44A, S46A, S49A, S50A, and S52A instead of steps S43, S44, S46, S49, S50, and S52 described with reference to FIG. 8.

At step S43A, the control unit 70 changes a control target temperature of a nozzle temperature to a nozzle temperature kn. The nozzle temperature kn is expressed by an equation below.

$$kn = k1 + \Delta k \times (n-1)$$

where k1 may be, for example, "260° C." and Δk may be, for example "+1° C.".

At step S44A, the control unit 70 determines whether or not the nozzle temperature is stable. The control unit 70 performs determination processing at step S44A based on nozzle temperature information obtained from the nozzle temperature monitor 103. When determining that the nozzle temperature is stable, the control unit 70 proceeds to step S45.

At step S45, the control unit 70 performs duty adjustment, and counts the number of candidate duty values. The processing at step S45 is the same as that in FIG. 19.

At step S46A, the control unit 70 stores the number of candidate duty values in association with kn.

When determining yes at step S48, the control unit 70 proceeds to step S49A.

At step S49A, the control unit 70 determines kn with the largest number of candidate duty values as an optimum nozzle temperature kopt.

At step S50A, the control unit 70 changes the specified temperature of the nozzle temperature to the optimum nozzle temperature kopt. The control unit 70 transmits a nozzle temperature instruction signal to the nozzle temperature control unit 152. The nozzle temperature control unit 152 transmits a heating/cooling device temperature instruction signal to the heating/cooling device power source 156 in accordance with the specified temperature specified by the nozzle temperature instruction signal.

The heating/cooling device power source 156 supplies, to the heating/cooling device 154, heating/cooling device drive power in accordance with the heating/cooling device temperature instruction signal. As such, the temperature of the heating/cooling device 154 is controlled to adjust the temperature of the nozzle 80.

At step S52A, the control unit 70 determines whether or not the nozzle temperature is stable based on the nozzle temperature information obtained through the nozzle temperature monitor 103. When determining that the nozzle temperature is not stable, the control unit 70 loops through the processing at step S52A and waits until the nozzle temperature is stabilized.

When determining that the nozzle temperature is stable at step S52A, the control unit 70 proceeds to step S53.

The processing at step S53 and step S54 is the same as that at step S13 and step S14 in FIG. 14.

The optimum nozzle temperature kopt corresponds to an operation specified temperature used in the EUV light emission process. Specifically, the optimum nozzle temperature is a specified temperature of a vibration propagating path member when a droplet is irradiated with a laser beam.

10.4 Effect

According to Embodiment 5, the same effect as that of Embodiment 2 can be obtained. In Embodiment 5, the nozzle temperature is adjusted using the heating/cooling device directly arranged on the nozzle 80 including the vibration propagating path. Thus, the temperature of the vibration propagating path can be changed with much higher accuracy than in the configurations in Embodiments 1 to 3. Thus, in the configuration in Embodiment 5, duty adjustment at the changed temperature can be performed with higher accuracy, and the duty value and the temperature at which droplet connection is facilitated can be set to more appropriate ones. This further stabilizes droplet connection and thus stabilizes EUV light emission.

11. Modifications of Embodiments

11.1 Modification 1

The configurations of Embodiments 1 to 5 can be combined as appropriate. For example, the configurations of Embodiment 4 and 5 can be combined. Both the piezoelectric unit temperature and the nozzle temperature may be used as adjustment parameters for the droplet connection condition, and the temperature adjustment of the piezoelectric unit 88 and the temperature adjustment of the nozzle 80 may be combined to specify an optimum temperature condition.

In this case, the combination of the piezoelectric unit temperature and the nozzle temperature may be set in a matrix manner to specify an optimum combination of the piezoelectric unit temperature, the nozzle temperature, and the duty value. Alternatively, a temperature difference between the piezoelectric unit temperature and the nozzle temperature may be used as a parameter to specify an optimum combination of the temperature difference and the duty value.

11.2 Modification 2

In the flowcharts in FIGS. 18 and 24, the duty adjustment is performed at step S53 as described above, but the processing at step S53 may be omitted. For example, the data obtained by the duty adjustment at step S45 can be stored to specify an optimum duty value condition corresponding to an optimum temperature using the stored data.

12. Exemplary Structure 1 of Piezoelectric Unit

12.1 Configuration

Figure 25:
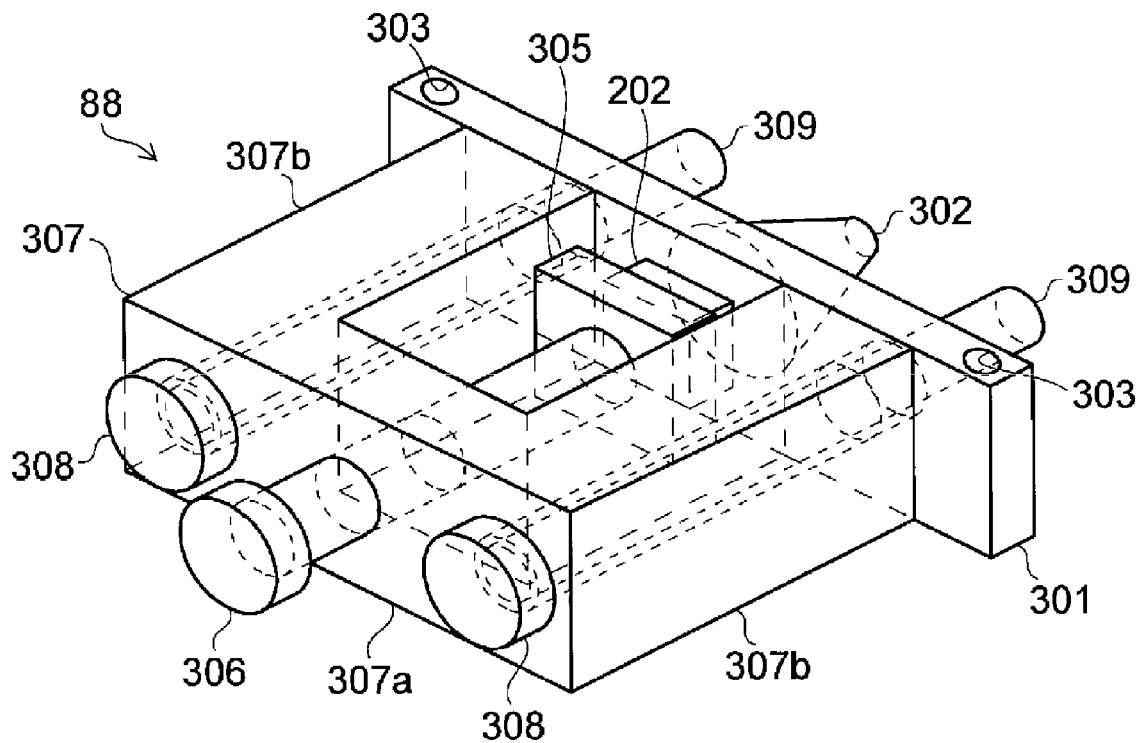
FIG. 25 is a perspective view of a first example of a structure of a piezoelectric unit 88.

FIG. 25 is a perspective view of an example of a piezoelectric unit 88. The piezoelectric unit 88 includes a piezoelectric element 202, a vibration transmitting member 301, a retainer member 305, a piezoelectric element holding bolt 306, a pressurizing member 307, and two pressure adjusting bolts 308.

Figure 26:
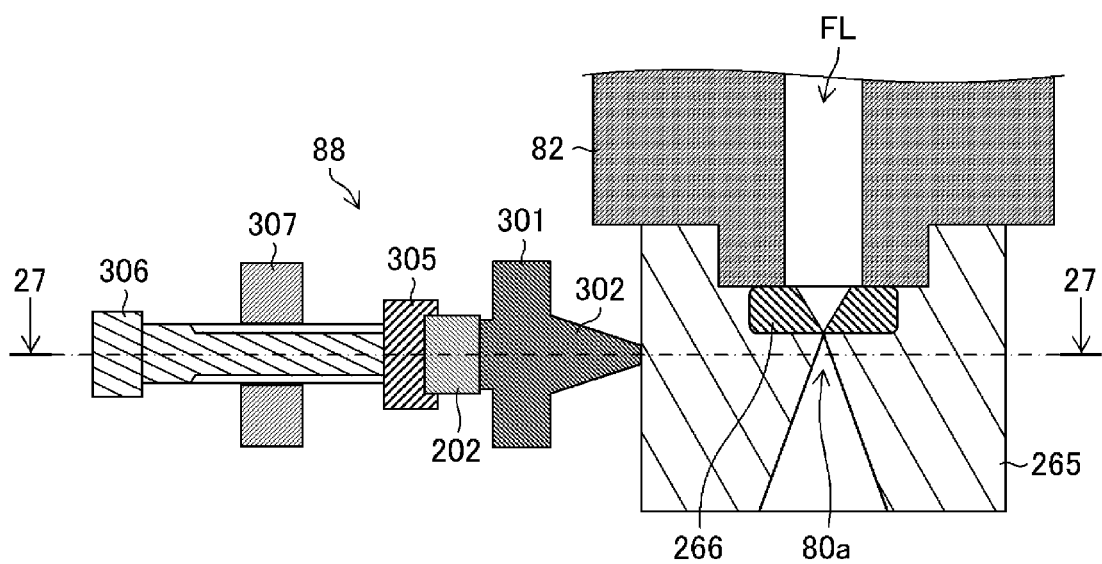
FIG. 26 is a cross-sectional view including a central axis of a piezoelectric element holding bolt of the piezoelectric unit in FIG. 25 and a central axis of a target channel.
Figure 27:
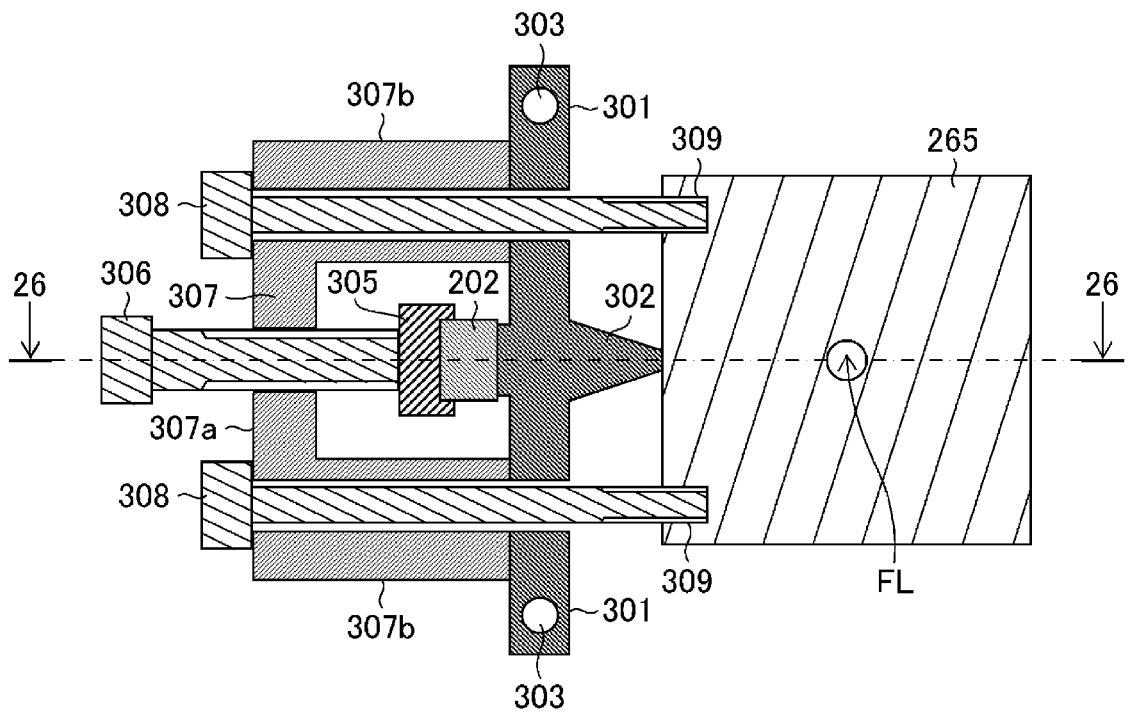
FIG. 27 is a cross-sectional view including central axes of two pressure adjusting bolts of the piezoelectric unit in FIG. 25.

FIG. 26 is a cross-sectional view including a central axis of the piezoelectric element holding bolt 306 and a central axis of a target channel FL. FIG. 27 is a cross-sectional view including central axes of the two pressure adjusting bolts 308 of the piezoelectric unit 88 in FIG. 25. FIG. 26 shows an example of a cross-section structure taken along the line 26-26 in FIG. 27, and FIG. 27 shows an example of a cross-section structure taken along the line 27-27 in FIG. 26.

As shown in FIGS. 25 to 27, the pressurizing member 307 may be a frame member of the piezoelectric unit 88. The pressurizing member 307 includes one arm 307b and the other arm 307b located on opposite sides, and a middle beam 307a coupling the arms 307b.

The vibration transmitting member 301 is arranged between the pressurizing member 307 and the nozzle holder 265. A truncated conical projection 302 with a narrow tip is provided at a middle of the vibration transmitting member 301. The tip of the projection 302 is in contact with a side surface of the nozzle holder 265. Contact area between the tip of the projection 302 and the side surface of the nozzle holder 265 may be smaller than area of any one surface of the piezoelectric element 202.

The two pressure adjusting bolts 308 fix the pressurizing member 307 and the vibration transmitting member 301 to the side surface of the nozzle holder 265. A tip of a shaft of each pressure adjusting bolt 308 may have a threaded portion 309. The side surface of the nozzle holder 265 has two threaded holes into which the threaded portions 309 of the two pressure adjusting bolts 308 are threaded. The two arms 307b of the pressurizing member 307 and the vibration transmitting member 301 each have two through holes through which the two pressure adjusting bolts 308 are inserted.

The piezoelectric element holding bolt 306 presses the retainer member 305 from one side surface of the piezoelectric element 202 and fixes the piezoelectric element 202 between the vibration transmitting member 301 and the retainer member 305. The middle beam 307a of the pressurizing member 307 has a threaded hole into which the piezoelectric element holding bolt 306 is threaded.

The vibration transmitting member 301 is pressed against the nozzle holder 265 by the piezoelectric element holding bolt 306 and the pressure adjusting bolts 308. The piezoelectric element holding bolt 306 presses, through the retainer member 305, the piezoelectric element 202 against the vibration transmitting member 301, and presses the projection 302 of the vibration transmitting member 301 against the nozzle holder 265. The piezoelectric element 202 may be connected to the piezoelectric power source 96 (see FIG. 3, etc.) by a wire (not shown).

The vibration transmitting member 301 has coolant passages 303. The coolant passages 303 are connected to the chiller unit 110 (see FIG. 3, etc.) through channels (not shown).

FIG. 26 shows a structure of the nozzle portion in which the nozzle member 266 is fixed to a bottom of the tank 82 through the nozzle holder 265, but the structure of the nozzle portion is not limited to that in FIG. 26. For example, the nozzle member 266 and the nozzle holder 265 may be integrated. The nozzle member 266 and the nozzle holder 265 in FIG. 26 are examples of components of the nozzle 80 in FIG. 3, etc. The nozzle member 266 has a nozzle hole 80a. The nozzle member 266 and the nozzle holder 265 may be vibration propagating path members including a vibration propagating path.

A position to which the piezoelectric unit 88 is mounted is not limited to the side surface of the nozzle holder 265. For example, the piezoelectric unit 88 may be mounted to a lower side surface of the tank 82. Specifically, the piezoelectric unit 88 may be mounted to any position as long as a target substance in the target channel FL near the nozzle hole 80a can be vibrated.

12.2 Operation

In the piezoelectric unit 88 in FIGS. 25 to 27, the pressure adjusting bolts 308 are threaded into the threaded holes in the nozzle holder 265, and thus pressure for pressing the vibration transmitting member 301 against the nozzle holder 265 is applied to opposite side ends of the vibration transmitting member 301. Also, the piezoelectric element holding bolt 306 is threaded into the beam 307a of the pressurizing member 307, and thus pressure for pressing the projection 302 against the nozzle holder 265 is applied to around the middle of the vibration transmitting member 301 through the retainer member 305 and the piezoelectric element 202. Similarly, pressure is applied for holding the piezoelectric element 202 between the retainer member 305 and the vibration transmitting member 301. The pressure applied by the piezoelectric element holding bolt 306 may be the pressure for pressing the projection 302 of the vibration transmitting member 301 against the nozzle holder 265.

The magnitude of the pressure can be adjusted by adjusting threading torque of each of the pressure adjusting bolts 308 and the piezoelectric element holding bolt 306. In this case, the threading torque of each of the pressure adjusting bolts 308 and the piezoelectric element holding bolt 306 is adjusted so that vibration generated by the piezoelectric element 202 propagates through the projection 302 of the vibration transmitting member 301 to the target substance in the target channel FL.

The piezoelectric element 202 generates vibration by expanding and contracting based on a voltage of a predetermined waveform applied from the piezoelectric power source 96. The generated vibration propagates through the vibration propagating path such as the projection 302 of the vibration transmitting member 301, the nozzle holder 265, and the nozzle member 266 to the target substance in the target channel FL.

13. Exemplary Structure 2 of Piezoelectric Unit 13.1 Configuration

Figure 28:
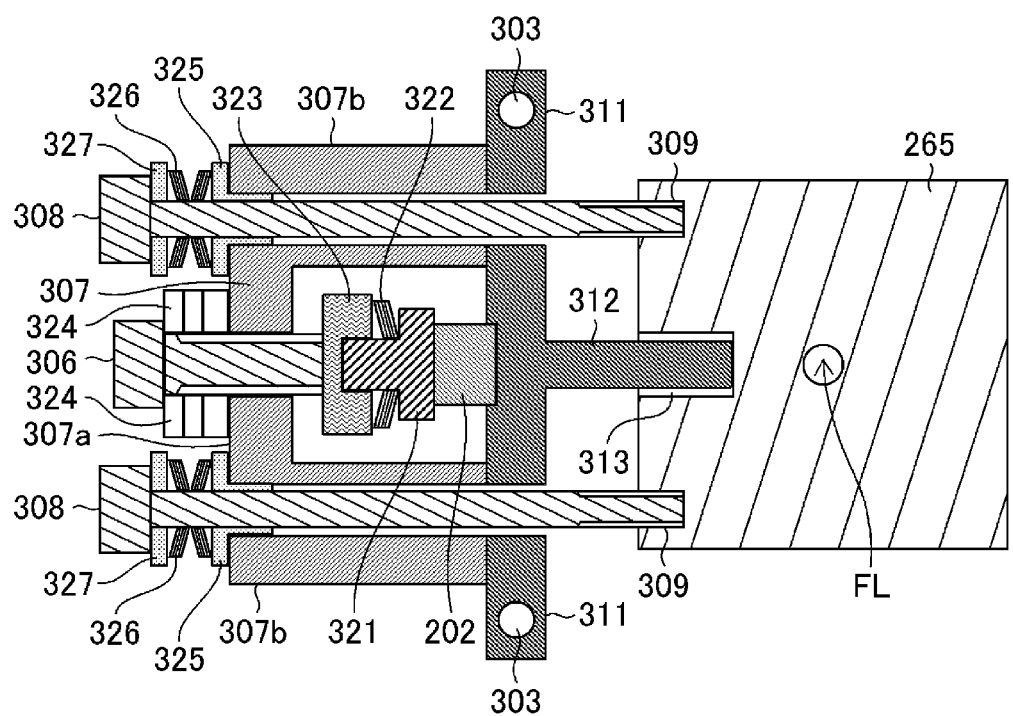
FIG. 28 is a cross-sectional view of a second example of a structure of a piezoelectric unit.

FIG. 28 is a cross-sectional view of a second example of a structure of a piezoelectric unit 88. FIG. 28 shows an exemplary structure of a cross-section corresponding to FIG. 27. In the description below, the same configurations as those of the piezoelectric unit 88 in FIGS. 25 to 27 are denoted by the same reference numerals, and overlapping descriptions will be omitted.

The piezoelectric unit 88 in FIG. 28 includes a vibration transmitting member 311 instead of the vibration transmitting member 301 in FIG. 25. In the vibration transmitting member 311, a vibration pin 312 replaces the projection 302 of the vibration transmitting member 301. The vibration pin 312 may be integrated with or separate from other components of the vibration transmitting member 311.

The vibration pin 312 may have a cylindrical shape. Circular sectional area of the vibration pin 312 may be smaller than area of any one surface of the piezoelectric element 202.

A vibration bore 313 is also provided in a contact portion between the nozzle holder 265 and the vibration transmitting member 311. A tip of the vibration pin 312 is in contact with a bottom of the vibration bore 313. The vibration bore 313 may be recessed from the side surface of the nozzle holder 265 toward the target channel FL. Specifically, the vibration bore 313 may be formed so that a contact position between the vibration pin 312 and the nozzle holder 265 is brought closer to the target channel FL.

An opening of the vibration bore 313 may have, not limited to the circular shape, various shapes such as a triangular shape or a square shape. The vibration bore 313 may be a groove formed in one side surface of the nozzle holder 265.

The piezoelectric unit 88 in FIG. 28 includes, instead of the retainer member 305 in FIG. 25, a piezoelectric element retainer member 321, a first elastic member 322, and a first base 323. The first base 323 is arranged on a tip of a shaft of the piezoelectric element holding bolt 306. The first base 323 and the piezoelectric element retainer member 321 may have a recess and a protrusion mating with each other. The first elastic member 322 is arranged between the first base 323 and the piezoelectric element retainer member 321. The first elastic member 322 may be a ring-like member that can be fitted on the protrusion of the piezoelectric element retainer member 321. The first elastic member 322 may be, for example, a disc spring.

Also, a shim 324 is arranged between a head of the piezoelectric element holding bolt 306 and the beam 307a of the pressurizing member 307.

Further, the piezoelectric unit 88 in FIG. 28 includes a second base 325, a second elastic member 326, and a washer 327 between each pressure adjusting bolt 308 and the pressurizing member 307. The second elastic member 326 is arranged between a head of the pressure adjusting bolt 308 and the pressurizing member 307. The second elastic member 326 may be a ring-like member that can be fitted on a shaft of the pressure adjusting bolt 308. The second elastic member 326 may be, for example, a disc spring.

The second base 325 is arranged between the second elastic member 326 and the pressurizing member 307. The washer 327 is arranged between the head of the pressure adjusting bolt 308 and the second elastic member 326. A shim (not shown) may be arranged between the head of the pressure adjusting bolt 308 and the washer 327.

13.2 Operation

In the piezoelectric unit 88 in FIG. 28, even if a difference in thermal expansion occurs between the members of the piezoelectric unit 88, an elastic force and a stroke of the second elastic member 326 can reduce variations in pressure applied to opposite side ends of the vibration transmitting member 311.

Elastic forces and strokes of the first elastic member 322 and the second elastic member 326 can also reduce variations in pressure applied to the vibration pin 312 of the vibration transmitting member 311.

The elastic forces and the strokes of the first elastic member 322 and the second elastic member 326 can further reduce variations in pressure applied to the piezoelectric element 202.

When the first elastic member 322 and the second elastic member 326 are disc springs, the elastic forces and the strokes thereof are adjusted by adjusting the number of disc springs used, overlapping direction, hardness, or the like.

Loads (preload) previously applied to the first elastic member 322 and the second elastic member 326 are adjusted by adjusting threading torque of each of the piezoelectric element holding bolt 306 and the pressure adjusting bolts 308. The preloads and the strokes may be adjusted by adjusting the thickness of the shim 324 or the number of the shims 324.

The pressure applied to the vibration pin 312 and the pressure applied to the piezoelectric element 202 may be adjusted so that, for example, contact pressure between the vibration pin 312 and the nozzle holder 265 is larger than contact pressure between the piezoelectric element 202 and the vibration transmitting member 311. In this case, the contact pressure between the piezoelectric element 202 and the vibration transmitting member 311 may be adjusted to, for example, about 30 MPa.

14. Laser Apparatus

The laser apparatus 14 may include a pre-pulse laser apparatus configured to output a pre-pulse laser beam, and a main pulse laser apparatus configured to output a main pulse laser beam. In the LPP EUV light generating apparatus 12, a target in the form of droplet is diffused through irradiation with a pre-pulse laser beam to form a diffused target, and then the diffused target is irradiated with a main pulse laser beam. When the diffused target is irradiated with the main pulse laser beam in this manner, plasma can be efficiently generated from the target substance. This can improve conversion efficiency (CE) from energy of a pulse laser beam into energy of EUV light.

The pre-pulse laser beam for forming a diffused target includes short pulses each having a pulse width shorter than one nanosecond [ns], preferably shorter than 500 picoseconds [ps], more preferably shorter than 50 picoseconds [ps]. Further, fluence of each pulse of the pre-pulse laser beam is equal to or lower than fluence of each pulse of the main pulse laser beam, and is equal to or higher than 6.5 J/cm$^2$, preferably equal to or higher than 30 J/cm$^2$, more preferably equal to or higher than 45 J/cm$^2$.

With such a configuration, the target can be diffused through breakdown into minute particles by reducing the pulse width of each pulse of the pre-pulse laser beam. Thus, when a diffused target is irradiated with the main pulse laser beam, plasma is efficiently generated from the target, which leads to improvement of CE.

The target may be irradiated with a plurality of pre-pulse laser beams before irradiation with the main pulse laser beam.

Figure 29:
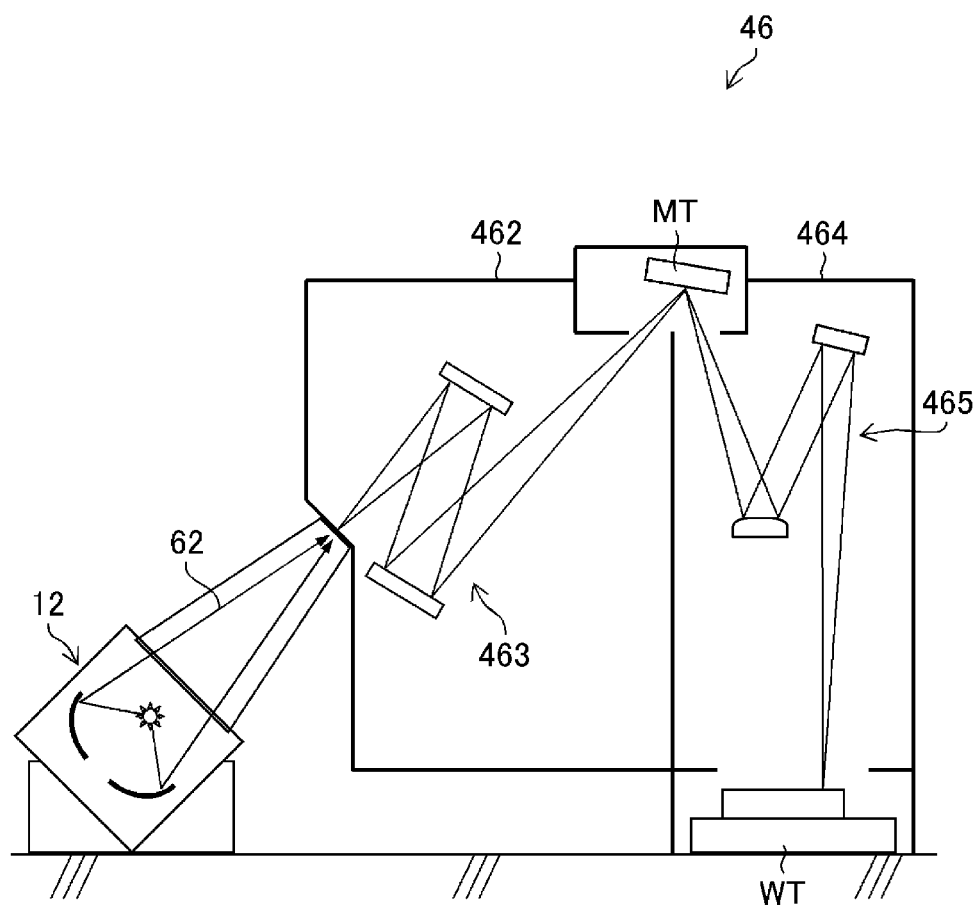
FIG. 29 schematically shows a configuration of an exposure apparatus connected to an EUV light generating apparatus.

15. Exemplary Electronic Device Manufacturing Method Using EUV Light Generating Apparatus FIG. 29 schematically shows a configuration of an exposure apparatus connected to an EUV light generating apparatus. In FIG. 29, the exposure apparatus 46 includes a mask irradiating unit 462 and a workpiece irradiating unit 464. The mask irradiating unit 462 illuminates, with EUV light 62 incident from the EUV light generating apparatus 12, a mask pattern on a mask table MT through a reflective optical system 463.

The workpiece irradiating unit 464 forms an image of the EUV light 62 reflected by the mask table MT on a workpiece (not shown) arranged on a workpiece table WT through a reflective optical system 465.

The workpiece is a photosensitive substrate such as a semiconductor wafer on which photoresist is applied. The exposure apparatus 46 synchronously translates the mask table MT and the workpiece table WT to expose the EUV light reflecting the mask pattern onto the workpiece.

Through an exposure process as described above, a device pattern is transferred onto the semiconductor wafer, thereby manufacturing a semiconductor device. The semiconductor device is an example of an electronic device.

The description above is intended to be illustrative and the present disclosure is not limited thereto. Therefore, it would be obvious to those skilled in the art that various modifications to the embodiments of the present disclosure would be possible without departing from the spirit and the scope of the appended claims. Further, it would be also obvious for those skilled in the art that embodiments of the present disclosure would be appropriately combined.

The terms used throughout the present specification and the appended claims should be interpreted as "non-limiting" terms. For example, terms such as "comprise", "include", "have", and "contain" should not be interpreted to be exclusive of other structural elements. Further, indefinite articles "a/an" described in the present specification and the appended claims should be interpreted to mean "at least one" or "one or more." Further, "at least one of A, B, and C" should be interpreted to mean any of A, B, C, A+B, A+C, B+C, and A+B+C as well as to include combinations of the any thereof and any other than A, B, and C.

What is claimed is:

1. A target supply device comprising:
   a nozzle from which a target substance is output;
   a vibrating element driven by a square wave electric signal and configured to generate a droplet of the target substance by vibrating the target substance to be output from the nozzle through a vibration propagating path;
   a temperature adjusting mechanism configured to adjust, to a specified temperature, a temperature of a vibration propagating path member including at least part of the vibration propagating path;
   a droplet detecting unit configured to detect the droplet generated by driving the vibrating element and to output a signal containing information on a droplet detection interval indicating a time interval of droplets that are continuously generated; and
   a control unit configured to determine, based on the droplet detection interval, an operation specified temperature that is the specified temperature of the vibration propagating path member when the droplet is irradiated with a laser beam, and an operation duty value that is a duty value of the electric signal used for driving the vibrating element when the droplet is irradiated with the laser beam.

2. The target supply device according to claim 1, wherein the control unit performs
   processing of setting an appropriate range of the droplet detection interval;
   processing of changing a combination of the specified temperature and the duty value of the electric signal, obtaining data on the droplet detection interval of the droplets generated in association with each combination of the specified temperature and the duty value of the electric signal, and storing the data on the droplet detection interval in association with the combination; and
   processing of determining the operation duty value and the operation specified temperature among combinations of the duty value and the specified temperature at which the stored droplet detection interval is within the appropriate range.

3. The target supply device according to claim 2, wherein the control unit calculates a predicted time interval of the droplets from a drive frequency at which the vibrating element is operated, and determines an upper limit value and a lower limit value of the appropriate range based on the calculated predicted time interval.

4. The target supply device according to claim 2, wherein the control unit performs
   processing of counting, based on the stored data on the droplet detection interval, the number of candidate duty values that is the number of the duty values satisfying a predetermined determination reference condition for each specified temperature of the combinations;
   processing of storing the number of candidate duty values in association with the specified temperature; and
   processing of determining the operation specified temperature based on the number of candidate duty values.

5. The target supply device according to claim 4, wherein the predetermined determination reference condition is that the droplet detection interval is within the appropriate range and that a variance of the droplet detection interval is equal to or lower than a defined upper limit.

6. The target supply device according to claim 4, wherein the control unit determines, as the operation specified temperature, the specified temperature with the largest number of candidate duty values.

7. The target supply device according to claim 2, wherein the control unit further performs processing of calculating a maximum value, a minimum value, an average value, and a variance of the droplet detection interval of the droplets generated in association with each changed combination, and
   stores the data indicating the maximum value, the minimum value, the average value, and the variance of the droplet detection interval that are calculated.

8. The target supply device according to claim 1, wherein the control unit performs processing of changing the specified temperature, changing the duty value of the electric signal in a temperature state of the vibration propagating path member adjusted to each specified temperature, and storing, in association with the specified temperature and the duty value, the droplet detection interval of the droplets generated in association with each changed duty value.

9. The target supply device according to claim 1, wherein the control unit determines the operation duty value based on a variance of the droplet detection interval of the droplets generated for each combination of the specified temperature and the duty value of the electric signal.

10. The target supply device according to claim 1, wherein the vibration propagating path member includes a vibrating unit configured to vibrate the nozzle, and
    the vibrating unit includes a vibration transmitting member in contact with the nozzle.

11. The target supply device according to claim 1, wherein the vibration propagating path member includes the nozzle.

12. The target supply device according to claim 1, further comprising a temperature sensor configured to detect the temperature of the vibration propagating path member,
    wherein the control unit controls the temperature adjusting mechanism based on temperature information obtained from the temperature sensor.

13. The target supply device according to claim 1, further comprising a chiller unit configured to circulate a coolant to be supplied to the vibration propagating path member,
    wherein the temperature adjusting mechanism is provided in the chiller unit and is configured to adjust an outlet temperature of the chiller unit.

14. The target supply device according to claim 1, further comprising a chiller unit configured to circulate a coolant to be supplied to the vibration propagating path member,
    wherein the temperature adjusting mechanism includes at least one of a heating device and a cooling device arranged in a coolant supply channel through which the coolant is supplied from a coolant outlet of the chiller unit to the vibration propagating path member.

15. The target supply device according to claim 1, wherein the temperature adjusting mechanism includes at least one of a heating device and a cooling device arranged in a vibrating unit including the vibrating element and the vibration propagating path member.

16. The target supply device according to claim 1, wherein the vibration propagating path member includes the nozzle, and the temperature adjusting mechanism includes at least one of a heating device and a cooling device arranged on/in the nozzle.

17. An extreme ultraviolet light generating apparatus that irradiates a target substance with a laser beam to generate plasma from which extreme ultraviolet light is generated, the extreme ultraviolet light generating apparatus comprising:

a chamber into which the laser beam is introduced;

a nozzle from which a target substance is output into the chamber;

a vibrating element driven by a square wave electric signal and configured to generate a droplet of the target substance by vibrating the target substance to be output from the nozzle through a vibration propagating path;

a temperature adjusting mechanism configured to adjust, to a specified temperature, a temperature of a vibration propagating path member including at least part of the vibration propagating path;

a droplet detecting unit configured to detect the droplet generated by driving the vibrating element and to output a signal containing information on a droplet detection interval indicating a time interval of droplets that are continuously generated; and a control unit configured to determine, based on the droplet detection interval, an operation specified temperature that is the specified temperature of the vibration propagating path member when the droplet is irradiated with the laser beam, and an operation duty value that is a duty value of the electric signal used for driving the vibrating element when the droplet is irradiated with the laser beam.

18. An electronic device manufacturing method comprising:

irradiating a target substance with a laser beam to generate plasma from which extreme ultraviolet light is generated, with an extreme ultraviolet light generating apparatus, the extreme ultraviolet light generating apparatus including a chamber into which the laser beam is introduced, a nozzle from which the target substance is output into the chamber, a vibrating element driven by a square wave electric signal and configured to generate a droplet of the target substance by vibrating the target substance to be output from the nozzle through a vibration propagating path, a temperature adjusting mechanism configured to adjust, to a specified temperature, a temperature of a vibration propagating path member including at least part of the vibration propagating path, a droplet detecting unit configured to detect the droplet generated by driving the vibrating element and to output a signal containing information on a droplet detection interval indicating a time interval of droplets that are continuously generated, and a control unit configured to determine, based on the droplet detection interval, an operation specified temperature that is the specified temperature of the vibration propagating path member when the droplet is irradiated with the laser beam, and an operation duty value that is a duty value of the electric signal used for driving the vibrating element when the droplet is irradiated with the laser beam;

outputting the extreme ultraviolet light to an exposure apparatus; and exposing the extreme ultraviolet light onto a photosensitive substrate within the exposure apparatus to manufacture an electronic device.

* * * * *